(12) United States Patent
Kim et al.

(10) Patent No.: US 9,741,441 B2
(45) Date of Patent: Aug. 22, 2017

(54) NONVOLATILE MEMORY SYSTEM INCLUDING NONVOLATILE MEMORY DEVICE AND MEMORY CONTROLLER AND OPERATING METHOD OF MEMORY CONTROLLER

(71) Applicant: SAMSUNG ELECTRONICS CO., LTD., Suwon-si, Gyeonggi-do (KR)

(72) Inventors: Kyungryun Kim, Seoul (KR); Sangyong Yoon, Seoul (KR); Kiwhan Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/232,909

(22) Filed: Aug. 10, 2016

(65) Prior Publication Data

US 2016/0351266 A1    Dec. 1, 2016

Related U.S. Application Data

(62) Division of application No. 14/668,072, filed on Mar. 25, 2015, now Pat. No. 9,449,695.

(30) Foreign Application Priority Data

May 13, 2014    (KR) ........................ 10-2014-0057306

(51) Int. Cl.
| | |
|---|---|
| *G11C 16/06* | (2006.01) |
| *G11C 16/28* | (2006.01) |
| *G11C 16/34* | (2006.01) |
| *G11C 16/10* | (2006.01) |
| *G11C 7/22* | (2006.01) |

(Continued)

(52) U.S. Cl.
CPC ............ *G11C 16/28* (2013.01); *G06F 3/0604* (2013.01); *G06F 3/0629* (2013.01); *G06F 3/0679* (2013.01); *G11C 7/227* (2013.01); *G11C 11/5628* (2013.01); *G11C 11/5635* (2013.01); *G11C 16/0483* (2013.01); *G11C 16/10* (2013.01); *G11C 16/30* (2013.01); *G11C 16/32* (2013.01); *G11C 16/3459* (2013.01); *G11C 2211/5621* (2013.01)

(58) Field of Classification Search
CPC ..... G11C 16/28; G11C 7/227; G11C 11/5628; G11C 11/5635
See application file for complete search history.

(56) References Cited

U.S. PATENT DOCUMENTS

| | | |
|---|---|---|
| 6,009,040 A | 12/1999 | Choi |
| 6,483,754 B1 | 11/2002 | Agrawal |

(Continued)

FOREIGN PATENT DOCUMENTS

| | | |
|---|---|---|
| JP | 2009026119 A | 2/2009 |
| JP | 2013003723 A | 1/2013 |

*Primary Examiner* — Pho M Luu
(74) *Attorney, Agent, or Firm* — Volentine & Whitt, PLLC

(57) ABSTRACT

A nonvolatile memory system includes a nonvolatile memory device including a plurality of memory cells, and a memory controller. The memory controller is configured to count a clock to generate a current time, program dummy data at predetermined memory cells among the plurality of memory cells at a power-off state, detect a charge loss of the predetermined memory cells when a power-on state occurs after the power-off state, and restore the current time based on the detected charge loss.

13 Claims, 30 Drawing Sheets

(51) Int. Cl.

| | |
|---|---|
| *G11C 11/56* | (2006.01) |
| *G11C 16/04* | (2006.01) |
| *G11C 16/32* | (2006.01) |
| *G06F 3/06* | (2006.01) |
| *G11C 16/30* | (2006.01) |

(56) References Cited

U.S. PATENT DOCUMENTS

| | | |
|---|---|---|
| 6,944,084 B2 | 9/2005 | Wilcox |
| 7,206,233 B2 * | 4/2007 | Shiota ................... G06F 13/161 365/189.04 |
| 7,505,334 B1 | 3/2009 | Breitwisch et al. |
| 7,649,776 B2 | 1/2010 | Abiko et al. |
| 7,679,133 B2 | 3/2010 | Son et al. |
| 7,944,744 B2 | 5/2011 | Bryant-Rich |
| 8,117,483 B2 * | 2/2012 | Welker ................ G06F 13/1689 713/500 |
| 8,261,136 B2 | 9/2012 | D'Abreu et al. |
| 8,312,240 B2 * | 11/2012 | Takemae ............ G06F 13/1694 365/233.16 |
| 8,553,466 B2 | 10/2013 | Han et al. |
| 8,559,235 B2 | 10/2013 | Yoon et al. |
| 8,654,587 B2 | 2/2014 | Yoon et al. |
| 8,677,217 B2 * | 3/2014 | Takeuchi ............ G06F 11/1068 714/764 |
| 8,886,874 B1 | 11/2014 | Sakalley |
| 9,218,867 B2 | 12/2015 | Shiratake |
| 9,449,695 B2 * | 9/2016 | Kim ....................... G11C 16/32 |
| 2011/0233648 A1 | 9/2011 | Seol et al. |
| 2012/0051133 A1 | 3/2012 | Kanda |
| 2012/0239976 A1 | 9/2012 | Cometti et al. |
| 2012/0294104 A1 | 11/2012 | Mun et al. |
| 2013/0185612 A1 | 7/2013 | Lee et al. |

\* cited by examiner

| Program Elapsed Time | Charge Loss |
|---|---|
| T_pe1<br>(100s) | CL1<br>(40mV) |
| T_pe2<br>(1000s) | CL2<br>(80mV) |
| T_pe3<br>(10,000s) | CL3<br>(150mV) |
| ⋮ | ⋮ |
| T_pen | CLn |

FIG. 22
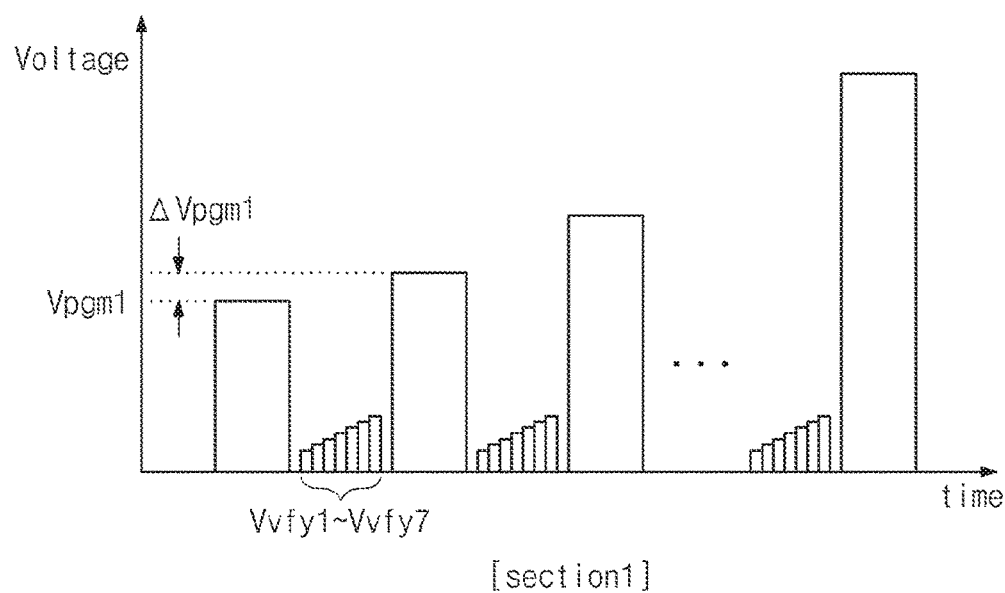
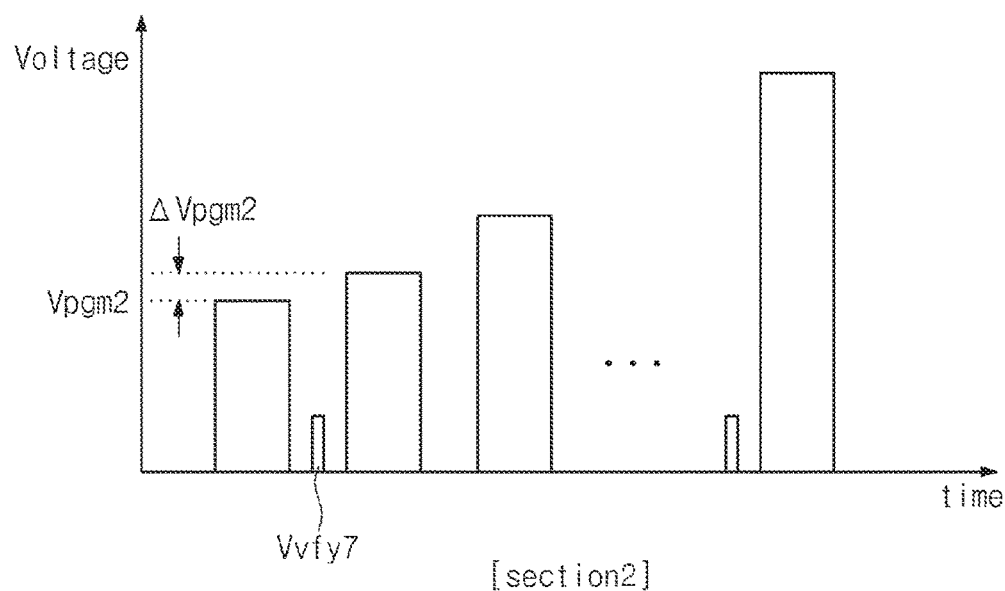

NONVOLATILE MEMORY SYSTEM INCLUDING NONVOLATILE MEMORY DEVICE AND MEMORY CONTROLLER AND OPERATING METHOD OF MEMORY CONTROLLER

CROSS-REFERENCE TO RELATED APPLICATIONS

This is a Divisional of U.S. application Ser. No. 14/668,072, filed Mar. 25, 2015, which issued on Sep. 20, 2016, as U.S. Pat. No. 9,449,695, and in which a claim for priority under 35 U.S.C. §119 is made to Korean Patent Application No. 10-2014-0057306 filed May 13, 2014, in the Korean Intellectual Property Office, the entire contents of which are hereby incorporated by reference.

BACKGROUND

The inventive concepts described herein relate to semiconductor memories, and more particularly, to nonvolatile memory systems and to methods of operation memory controllers.

A semiconductor memory device is a memory device which is fabricated using semiconductors such as, but not limited to, silicon (Si), germanium (Ge), gallium arsenide (GaAs), indium phosphide (InP), and the like. Semiconductor memory devices are generally classified as either volatile memory devices or nonvolatile memory devices.

The volatile memory devices lose contents stored therein at power-off, and examples thereof static RAM (SRAM), dynamic RAM (DRAM), synchronous DRAM (SDRAM), and so on. In contrast, nonvolatile memory devices retain stored contents even at power-off, and examples thereof includes read only memory (ROM), a programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and so on.

Among nonvolatile memories, flash memory in particular has been adopted in a wide variety of applications due to its inherent operational advantages such as high memory capacity, low noise characteristics, low power consumption and fast operating speeds. For example, flash memory is commonly used as a storage medium in mobile systems, such as smart phone, table PC's, and so on.

Flash memory contains semiconductor elements such as a floating gate memory cell, a charge trap flash (CTF) memory cell, and so on. Among these, the CTF memory cell may trap charge in a charge storage layer to store data. In other words, a threshold voltage of the CTF memory cell may be set by varying an amount of charges trapped in a storage layer, and data may be stored according to the set threshold. However, over time the charges trapped in the storage area may leak into a channel layer, which can cause the threshold voltage to drift from an initial state. As a result, data stored in the CTF memory cell may be lost.

SUMMARY

One aspect of embodiments of the inventive concepts are directed to provide a nonvolatile memory system comprising a nonvolatile memory device including a plurality of memory cells, and a memory controller. The memory controller is configured to count a clock to generate a current time, program dummy data at predetermined memory cells among the plurality of memory cells at a power-off state, detect a charge loss of the predetermined memory cells when a power-on state occurs after the power-off state, and restore the current time based on the detected charge loss.

In exemplary embodiments, the charge loss is indicative of a variation in threshold voltages of the predetermined memory cells with the lapse of time.

In exemplary embodiments, the plurality of memory cells are programmed to one of a plurality of program states, and the dummy data is programmed such that the predetermined memory cells are programmed to an uppermost program state among the plurality of program states. Here, the uppermost program state is a program state having a highest threshold voltage distribution among the plurality of program states.

In exemplary embodiments, the nonvolatile memory device is configured to perform a plurality of program loops to program the dummy data at the predetermined memory cells under control of the memory controller. Here, each of the plurality of program loops includes a program step of applying a program voltage and a verification step of applying a verification voltage for verifying the uppermost program state.

In exemplary embodiments, the predetermined memory cells are memory cells connected to a same wordline.

In exemplary embodiments, the memory controller is configured to select the same wordline, and memory cells connected to wordlines adjacent to the same wordline have an erase state.

In exemplary embodiments, the memory controller includes a lookup table storing information on a relation between program elapsed times and charge losses.

In exemplary embodiments, the memory controller is configured to detect a program elapsed time of the predetermined memory cells based on the detected charge loss and the lookup table.

In exemplary embodiments, the memory controller further includes a time table storing program time information of the predetermined memory cells.

In exemplary embodiments, the memory controller is configured to restore the current time based on the program time information of the predetermined memory cells of the time table and the detected program elapsed time.

In exemplary embodiments, the time table further includes program time information of the plurality of memory cells. The memory controller adjusts a plurality of read voltages of the nonvolatile memory device based on the time table and the restored current time.

In exemplary embodiments, the memory controller is configured to detect the charge loss based on at least one of characteristics of the predetermined memory cells. The characteristics include at least one of a peak value, a lower value, and a valley value of a threshold voltage distribution of the predetermined memory cells, the number of on cells, and the number of off cells. The number of on cells is the number of memory cells turned on when a reference voltage is applied to the predetermined memory cells. The number of off cells is the number of memory cells turned off when the reference voltage is applied to the predetermined memory cells.

In exemplary embodiments, the nonvolatile memory device further comprises at least one dummy block, and the memory controller is configured to select a portion of the at least one dummy block as the predetermined memory cells and program the dummy data at the selected memory cells.

In exemplary embodiments, the selected memory cells are memory cells connected to at least two or more wordlines.

In exemplary embodiments, the memory controller is configured to detect charge losses of the predetermined memory cells and restore the current time based on one of an average value and an intermediate value of the detected charge losses.

In exemplary embodiments, the plurality of memory cells are charge trap flash memory cells.

In exemplary embodiments, the memory controller includes a timer that counts the clock to generate the current time.

In exemplary embodiments, the clock is received from an external device.

In exemplary embodiments, the clock is generated in the memory controller.

Another aspect of embodiments of the inventive concepts is directed to provide an operating method for a memory controller which controls a nonvolatile memory device including a plurality of memory cells. The method comprises programming dummy data at predetermined memory cells among the plurality of memory cells at a power-off state, detecting a charge loss of the predetermined memory cells when a power-on state occurs after the power-off state, and restoring a current time based on the detected charge loss.

In exemplary embodiments, programming the dummy data at the predetermined memory cells of the plurality of memory cells at the power-off state comprises programming the predetermined memory cells to an uppermost program state among a plurality of program states. The uppermost program state is a program state having the highest threshold voltage distribution among the plurality of program states.

In exemplary embodiments, programming the dummy data at the predetermined memory cells of the plurality of memory cells at the power-off state comprises selecting a predetermined wordline, the predetermined wordline being a wordline connected to the predetermined memory cells.

In exemplary embodiments, selecting the predetermined wordline comprises selecting a wordline as the predetermined wordline, memory cells connected to wordlines adjacent to the wordline being at an erase state.

In exemplary embodiments, programming the dummy data at the predetermined memory cells of the plurality of memory cells at the power-off further comprises programming the dummy data at the predetermined memory cells and programming upper and lower dummy data at memory cells connected to wordlines adjacent to the predetermined wordline.

In exemplary embodiments, detecting the charge loss of the predetermined memory cells when the power-on state occurs after the power-off state comprises detecting the charge loss based on at least one of characteristics of the predetermined memory cells. The characteristics include at least one of a peak value, a lower value, and a valley value of a threshold voltage distribution of the predetermined memory cells, the number of on cells, and the number of off cells. The number of on cells is the number of memory cells turned on when a reference voltage is applied to the predetermined memory cells. The number of off cells is the number of memory cells turned off when the reference voltage is applied to the predetermined memory cells.

In exemplary embodiments, restoring the current time based on the detected charge loss comprises restoring the current time based on a lookup table storing information on a relation between the charge loss and a program elapsed time.

In exemplary embodiments, the method further comprises adjusting a plurality of read voltages of the nonvolatile memory device based on the restored current time.

Still another aspect of embodiments of the inventive concepts are directed to provide a nonvolatile memory system comprising a nonvolatile memory device including a plurality of memory cells, and a memory controller configured to count a clock to generate a current time, and periodically program dummy data at predetermined memory cells among the plurality of memory cells. The memory controller is further configured to detect a charge loss of memory cells at which dummy data is most recently programmed from among the predetermined memory cells when a power-on state occurs after a power-off state.

In exemplary embodiments, the power-off state is a result of a sudden loss of power.

In exemplary embodiments, the memory controller is configured to program the dummy data during a background operation.

In exemplary embodiments, the memory controller includes a lookup table storing information on a relation between the charge loss and an elapsed time.

In exemplary embodiments, the memory controller is configured to restore the current time based on the detected charge loss and the lookup table.

In exemplary embodiments, the memory controller is configured to periodically detect a charge loss of memory cells at which the dummy data is programmed and update the lookup table based on the periodically detected charge loss.

A further aspect of embodiments of the inventive concepts are directed to provide a nonvolatile memory system comprising a nonvolatile memory device including a plurality of memory cells, and a memory controller configured to count a clock to generate a current time, detect a charge loss of most recently programmed memory cells among the plurality of memory cells when a power-on state occurs after a power-off state, and restore the current time based on the detected charge loss.

BRIEF DESCRIPTION OF THE FIGURES

The above and other aspects and features will become apparent from the detailed description that follows with reference to the accompanying figures, wherein like reference numerals refer to like parts throughout the various figures unless otherwise specified, and wherein:

FIG. 12 is a diagram schematically illustrating an example of a program elapsed time to charge loss lookup table (LUT) shown in FIG. 1;

FIG. 22 is a diagram schematically illustrating an example of a program operation of a nonvolatile memory device shown in FIG. 1;

DETAILED DESCRIPTION

Figure 1:
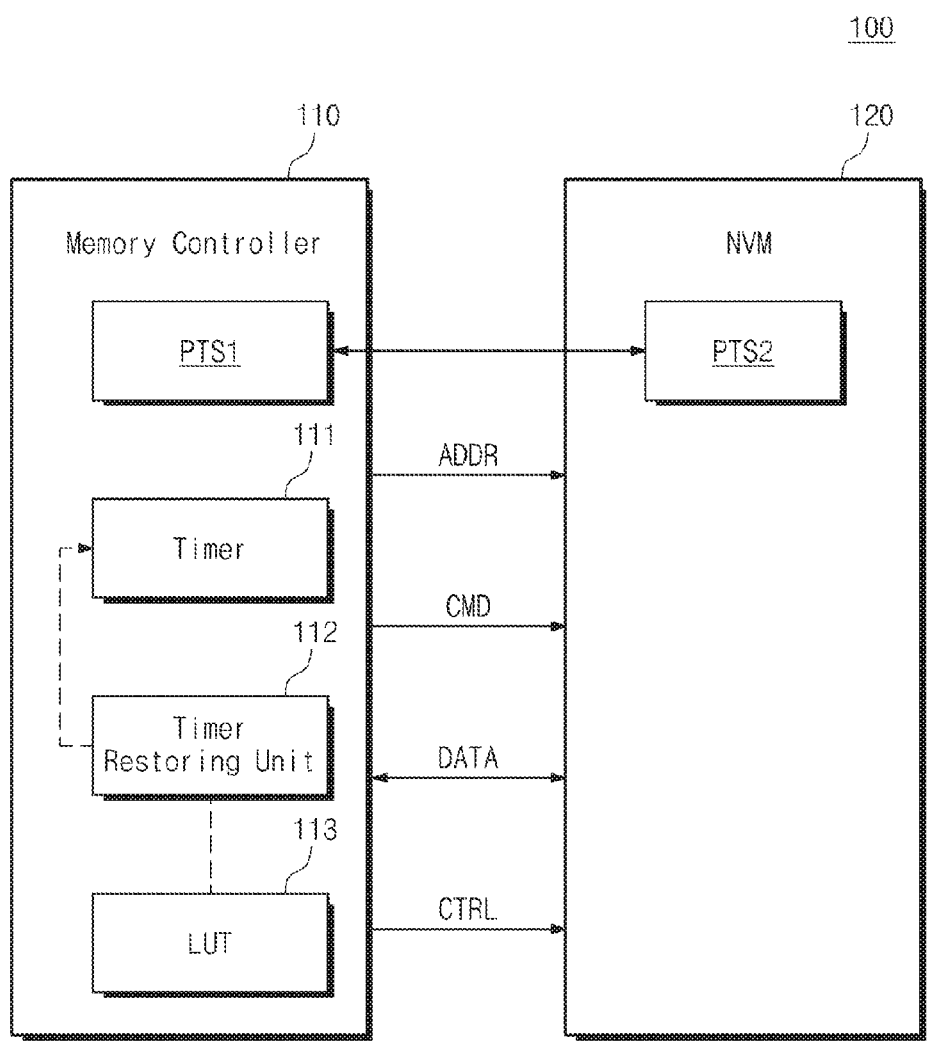
FIG. 1 is a block diagram schematically illustrating a nonvolatile memory system according to an embodiment of the inventive concept.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A memory controller controlling a nonvolatile memory device may sense a variation in threshold voltages of specific memory cells included in the nonvolatile memory device, and restore a timer based on the sensed variation. In addition, the memory controller may adjust a read voltage of the nonvolatile memory device based on a program elapsed time and the restored timer.

FIG. 1 is a block diagram schematically illustrating a nonvolatile memory system according to an embodiment of the inventive concepts. Referring to FIG. 1, a nonvolatile memory system 100 contains a memory controller 110 and a nonvolatile memory device 120.

In operation, the memory controller 110 sends an address ADDR, a command CMD, and a control signal CTRL to the nonvolatile memory device 120, and exchanges data with the nonvolatile memory device 120. The nonvolatile memory device 120 stores data in response to signals received from the memory controller 110, and transfers read data to the memory controller 110 in response to signals received from the memory controller 110.

The memory controller 110 of this embodiment includes a first program time stamp table PTS1, a timer 111, a timer restoring unit 112, and a program elapsed time to charge loss lookup table (LUT) 113.

The first program time stamp table PTS1 (hereinafter, referred to as a first time table) includes program time information about each page data stored in the nonvolatile memory device 120. For example, the program time information indicates the time when each page data is programmed. For ease of description, it is assumed that the first time table PTS1 is configured to manage program time information by the page unit (i.e., on a page by page basis). However, the inventive concepts are not limited thereto. For example, the program time information may be managed by the page unit, the wordline unit, the sub block unit, the memory block unit, and so on. The first time table PTS1 may be read out from the nonvolatile memory device 120 at power-on.

The timer 111 may generate a current time based on time information from an external device (e.g., a host, an application processor (AP), and so on). Alternatively, the timer 111 may counts a clock to generate a current time. For example, the clock may be supplied from the external device or may be generated internally. The timer 111 may be implemented with hardware and/or by software and/or firmware. A current time from the timer 111 may be an absolute time. Alternatively, the current time from the timer 111 may be a relative time on the basis of a reference point in time.

The program time information stored in the first time table PTS1 may be stored based on the current time generated by the timer 111.

The memory controller 110 may adjust a read voltage of the nonvolatile memory device 120 based on the first time table PTS1 and the timer 111. As an operational example, the memory controller 110 may require execution of a read operation of a first page. In this case, the memory controller 110 may detect a program elapsed time based on program time information of the first page included in the first time table PTS1 and a current time generated from the timer 111. The memory controller 110 adjusts levels of a plurality of read voltages used in the nonvolatile memory device 120, based on the detected program elapsed time.

The timer restoring unit 112 may restore the timer 111. For example, the timer 111 counts a clock to generate a current time. That is, if the memory controller 110 or the nonvolatile memory system 100 has stopped receiving a power supply, that is, at a power-off state (referred to simply as power-off herein), the timer 111 is reset or does not count an elapsed time during power-off. Then, when power is restored at a power-on state (referred simply as power-on herein), the time restoring unit 112 detects a program elapsed time of predetermined memory cells (or, specific memory cells) included in the nonvolatile memory device 120 by detecting charge loss of the predetermined memory cells (or, specific memory cells). The timer restoring unit 112 may restore a current time of the timer 111 based on the detected program elapsed time and program time information of the predetermined memory cells (or, specific memory cells). An operation of the timer restoring unit 112 will be more fully described later with reference to accompanying drawings.

As described previously, a charge loss in a memory cell may occur which can result a variation in a threshold voltage of this memory cell. The charge loss will be more fully described with reference to FIG. 5.

The program elapsed time to charge loss lookup table (hereinafter, referred to as LUT) 113 includes information of a program elapsed time to charge loss or information of charge loss to the program elapsed time. The timer restoring unit 112 detects a program elapsed time of predetermined memory cells based on the LUT 113.

The nonvolatile memory device 120 contains a second program time stamp table (hereinafter, referred to as a second time table) PTS2. The memory controller 110 flushes the first time table PTS1 into the nonvolatile memory device 112 as the second time table PTS2 periodically or randomly. For example, the second time table PTS2 may be stored at a meta area of the nonvolatile memory device 120 during idle time.

With this embodiment of the inventive concepts, when the nonvolatile memory system 100 is powered off and then powered on, the memory controller 110 detects charge loss of predetermined memory cells of the nonvolatile memory device 120 and detects a program elapsed time of the predetermined memory cells based on the detected charge loss. The memory controller 110 restores a current time of the timer 111 based on the detected program elapsed time. The memory controller 110 may adjust a read voltage of the nonvolatile memory device 120 based on the restored current time, which can result in an improved reliability of the nonvolatile memory system 100.

Figure 2:
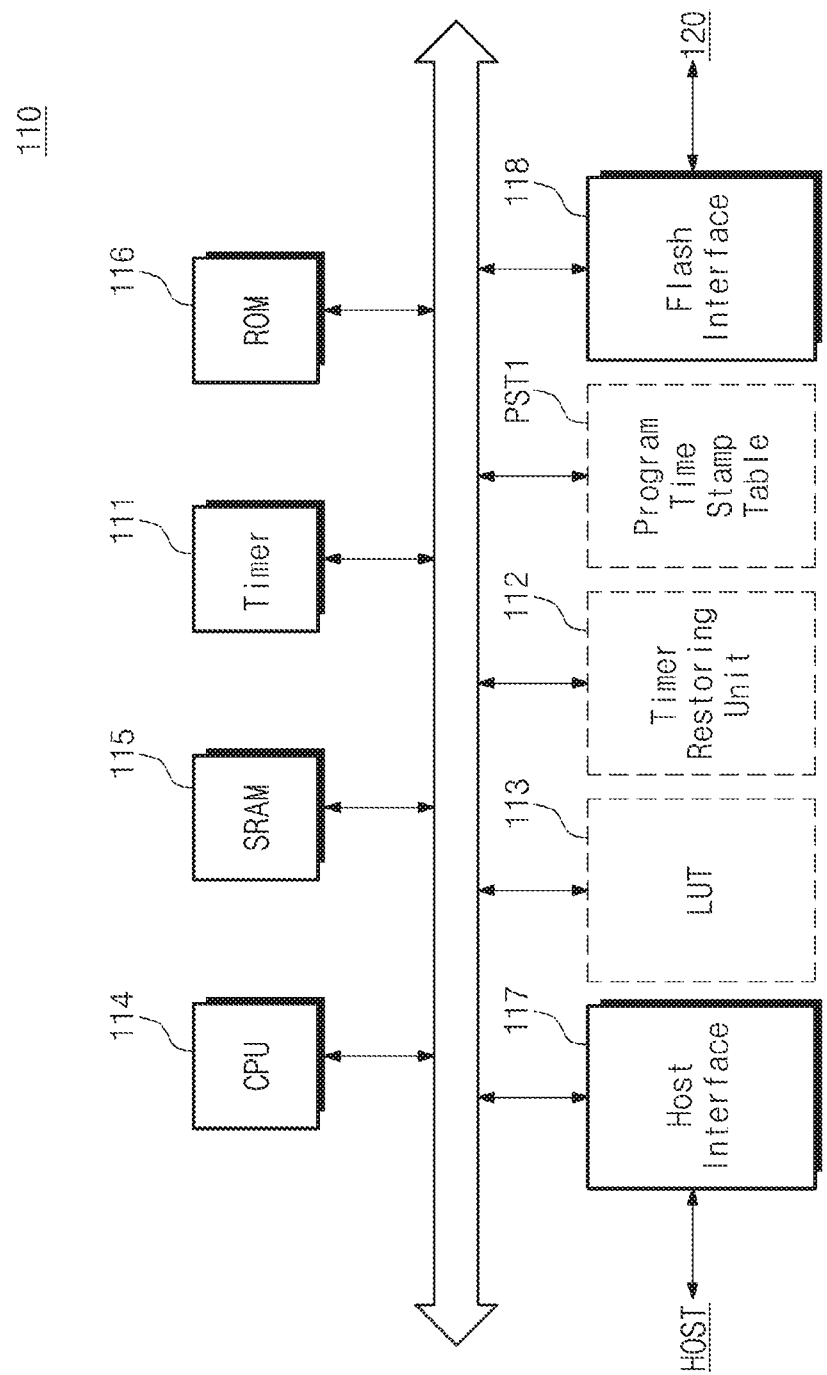
FIG. 2 is a block diagram schematically illustrating an example of a memory controller shown in FIG. 1.

FIG. 2 is a block diagram schematically illustrating an example of a memory controller shown in FIG. 1. Referring to FIGS. 1 and 2, a memory controller 110 includes a timer 111, a timer restoring unit 112, an LUT 113, a central processing unit (CPU) 114, a SRAM 115, a ROM 116, a host interface 117, a flash interface 118, and a first time table PTS1. The components 111, 112, 113, and PTS1 are previously described in detail with reference to FIG. 1, and a description thereof is thus omitted here.

Referring to FIGS. 1 and 2, the CPU 114 controls an overall operation of the memory controller 110. The timer 111 and the timer restoring unit 112 may be implemented by software and may be driven by the CPU 114.

The SRAM 115 may be used as a buffer memory, a cache memory, a main memory, or a working memory of the memory controller 110. In exemplary embodiments, the LUT 113 and the first time table PTS1 may be stored in the SRAM 115.

The ROM 116 stores information needed for an operation of the memory controller 110 in the form of firmware. The timer 111, the timer restoring unit 112, and the LUT 113 may be stored in the ROM 116 in the form of firmware.

In exemplary embodiments, the timer 111, the timer restoring unit 112, and the LUT 113 may be stored at a meta area of the nonvolatile memory device 120 in the form of software (e.g., program codes). At booting of the nonvolatile memory system 100, the memory controller 110 may read program codes stored in the nonvolatile memory device 120 and then execute the read program codes. Information (e.g., mapping table) required at booting of the memory controller 110 and the above-described components may be stored at the meta area (not shown) of the nonvolatile memory device 120.

The memory controller 110 may communicate with an external device (e.g., a host, an AP, and so on) via the host interface 117. For example, the host interface 117 may be implemented with at least one of various interfaces, such as an Universal Serial Bus (USB), a multimedia card (MMC), an embedded-MMC (eMMC), a peripheral component interconnection) (PCI), PCI-E (PCI-express), an Advanced Technology Attachment (ATA), a Serial-ATA (SATA), a Parallel-ATA (PATA), a small computer small interface (SCSI), an enhanced small disk interface (ESDI), an Integrated Drive Electronics (IDE), a Mobile Industry Processor Interface (MIPI), a Nonvolatile memory express (NVMe), an Universal Flash Storage (UFS), and so on. The memory controller 110 may communicate with the nonvolatile memory device 120 via the flash interface 118.

Figure 3:
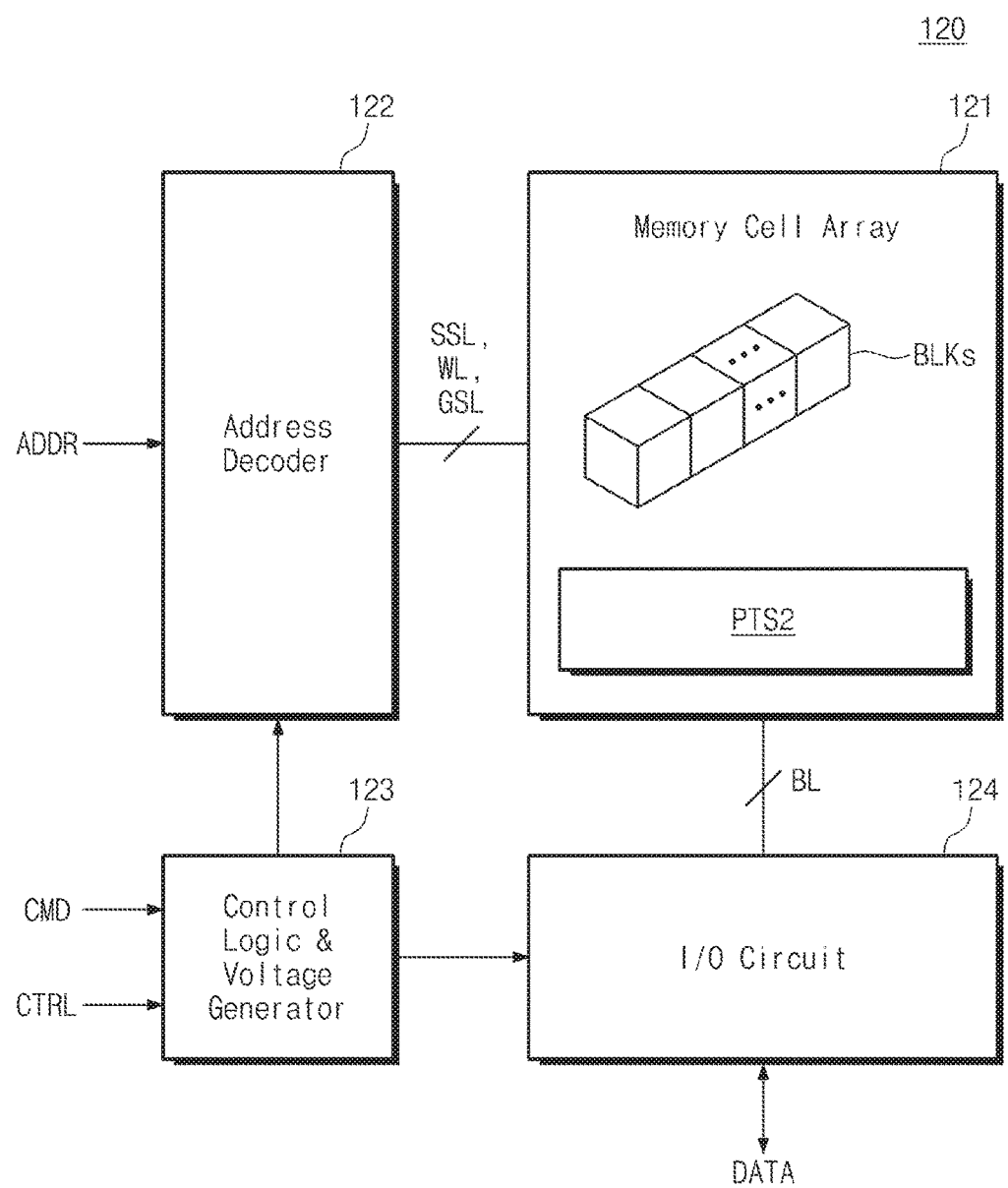
FIG. 3 is a block diagram schematically illustrating an example of a nonvolatile memory device shown in FIG. 1.

FIG. 3 is a block diagram schematically illustrating an example of the nonvolatile memory device 120 shown in FIG. 1. Referring to FIGS. 1 and 3, a nonvolatile memory device 120 includes a memory cell array 121, an address decoder 122, a control logic and voltage generator block 123, and an input/output circuit 124.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The memory cell array 121 contains a plurality of memory blocks. Each of the memory blocks includes a plurality of strings formed of a plurality of memory cells. Each memory cell may be a single level cell storing one bit or a multi-level cell storing at least two bits. In exemplary embodiments, the memory blocks may have a three-dimensional structure.

The address decoder 122 is connected to the memory cell array 121 through wordlines WL, string select lines SSL, and ground selection lines GSL. The address decoder 122 is configured to decode a row address of an address ADDR received from a memory controller 110 and selects the wordlines WL, the string select lines SSL, and the ground selection lines GSL based on the decoded row address. In exemplary embodiments, the address decoder 122 may include components such as a row decoder, a column decoder, an address buffer, and so on.

The control logic and voltage generator block 123 may control the address decoder 122 and the input/output circuit 124 in response to a command CMD and a control signal CTRL from the memory controller 110. The control logic and voltage generator block 123 may generate various voltages needed for an operation of the nonvolatile memory device 120. For example, the control logic and voltage generator block 123 may generate a plurality of select read voltages, a plurality of unselect read voltages, a plurality of program voltages, a plurality of pass voltages, a plurality of local voltages, a plurality of erase voltages, and so on. In exemplary embodiments, the control logic and voltage generator block 123 may adjust the selection read voltages according to a control of the memory controller 110.

The input/output circuit 124 is connected to the memory cell array 121 through bitlines BL and exchanges data with the memory controller 110. Under a control of the control logic and voltage generator block 123, the input/output circuit 124 reads data from the memory cell array 121 and outputs the read data to the memory controller 110. The input/output circuit 124 receives data from the memory controller 110 and writes the received data at the memory cell array 121 according to a control of the control logic and voltage generator block 123. For instance, the input/output 124 may perform a copy-back operation.

The input/output circuit 124 may include components such as a page buffer (or, a page register), a column selector, a data buffer, a global buffer, and so on, although not shown. Alternatively, the input/output circuit 124 may contain components such as a sense amplifier, a write driver, a column selector, a data buffer, and so on, although not shown.

Figure 4:
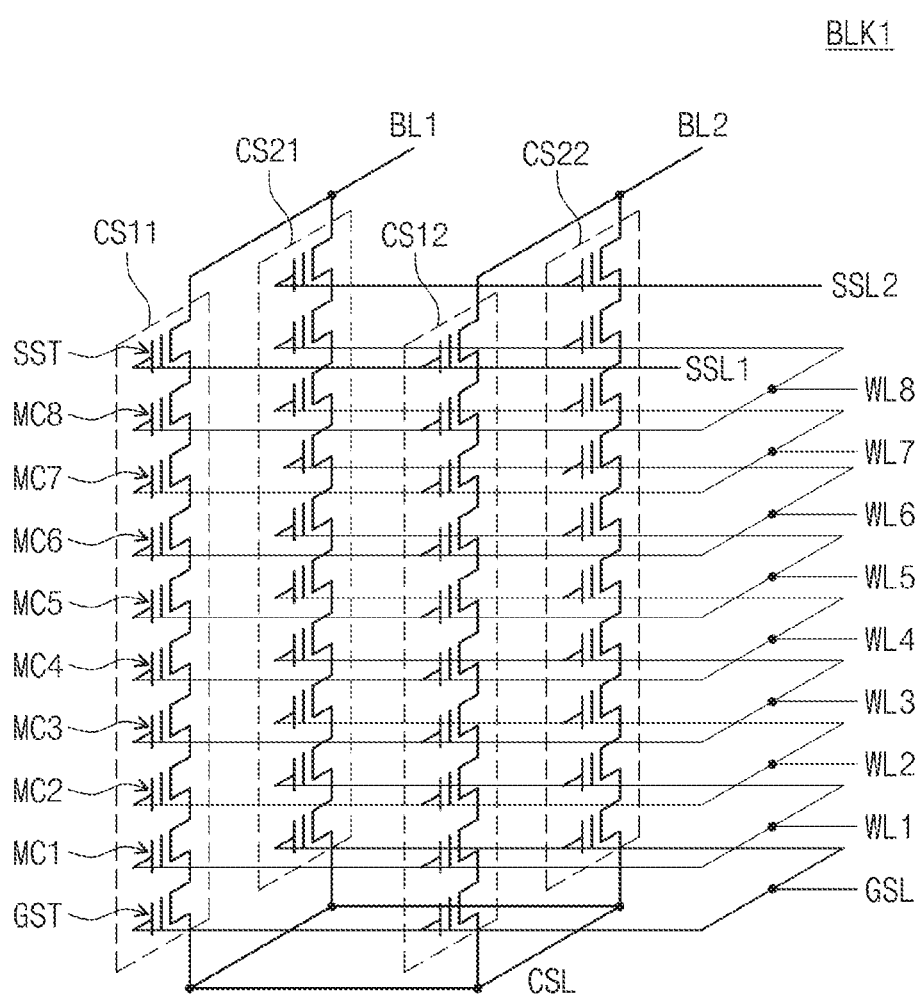
FIG. 4 is a circuit diagram schematically illustrating an example of a first memory block of a memory cell array shown in FIG. 3.

FIG. 4 is a circuit diagram schematically illustrating an example of a first memory block of a memory cell array shown in FIG. 3. In FIG. 4, there is illustrated a first memory block BLK1. However, the inventive concepts are not limited thereto. The remaining memory blocks may have the same structure as the first memory block.

Referring to FIGS. 3 and 4, the first memory block BLK1 includes a plurality of cell strings CS11, CS21, CS12, and CS22. The cell strings CS11, CS21, CS12, and CS22 are arranged along a row direction and a column direction and form rows and columns.

Each of the cell strings CS11, CS21, CS12, and CS22 includes a plurality of cell transistors. The cell transistors include a string selection transistor SST, a plurality of memory cells MC1 to MC8, and a ground selection transistor GST. In each cell string, with a string selection line SSL connects the string selection transistor SST. The string selection line SSL is divided into first and second string selection lines SSL1 and SSL2. In each cell string, the memory cells MC1 to MC8 are connected to wordlines WL1 to WL8, respectively. Wordlines at the same height are interconnected in common. In each cell string, with a ground selection line connects the ground selection transistors GST. Each cell string is connected between a bitline and a common source line CSL. That is, in each cell string, the string selection transistor SST is connected to the bitline BL and the ground selection transistor GST is connected to the common source line CSL.

Cell strings in the same column are connected to the same bitline. For example, a first bitline BL1 connects with the cell strings CS11 and CS21. A second bitline BL2 connects with the cell strings CS12 and CS22.

Cell strings in the same row are connected to the same string selection line. For example, the first string selection line SSL1 connects with the cell strings CS11 and CS12. The second string selection line SSL2 connects with the cell strings CS21 and CS22.

The plurality of cell strings CS11, CS12, CS21, and CS22 are stacked in a direction perpendicular to a substrate (not shown). For example, the ground selection transistor GST, the memory cells MC1 to MC8, and the string selection transistor SST are stacked in a direction perpendicular to the substrate. The memory cells MC1 to MC8 may be charge trap flash (CTF) memory cells. Threshold voltages of the CTF memory cells may vary as time elapses. The reason is that charge stored in a charge storage layer of each CTF memory cell moves into a channel layer as time elapses. This physical characteristic of the CTF memory cells is referred to as IVS (Initial Verify Shift). The IVS (Initial Verify Shift) will be more fully described with reference to FIG. 5.

The first memory block BLK1 illustrated in FIG. 4 is exemplary, and the inventive concepts are not limited thereto. For example, the number of rows of cell strings may increase or decrease relative to those of FIG. 4. As the number of rows of cell strings is varied, the number of string selection lines or the number of ground selection lines connected to rows of cell strings and the number of cell strings connected to a bitline may be also changed.

The number of columns of cell strings may increase or decrease relative to those of FIG. 4. As the number of columns of cell strings is varied, the number of bitlines connected to columns of cell strings and the number of cell strings connected to a string selection line may be also changed.

The height of cell strings may increase or decrease relative to those of FIG. 4. For example, the number of stacked memory cells in each cell string may increase or decrease. In this case, the number of wordlines may be also changed. For example, the number of ground or string selection transistors in each cell string may increase. In this case, the number of ground or string selection lines may be also changed. If the number of ground or string selection transistors increases, ground or string selection transistors may be stacked like as a stacked structure of the memory cells.

In example embodiments, a read operation and a write operation may be performed by the row unit. The cell strings CS11, CS21, CS12, and CS22 may be selected by the row unit by selectively activating the string selection lines SSL1 and SSL2.

In a selected row of cell strings, the read operation and the write operation may be performed by the page unit. A page may be a row of memory cells connected to a same wordline. In a selected row of cell strings, memory cells may be selected by the wordlines WL1 to WL8 as the page unit.

Figure 5:
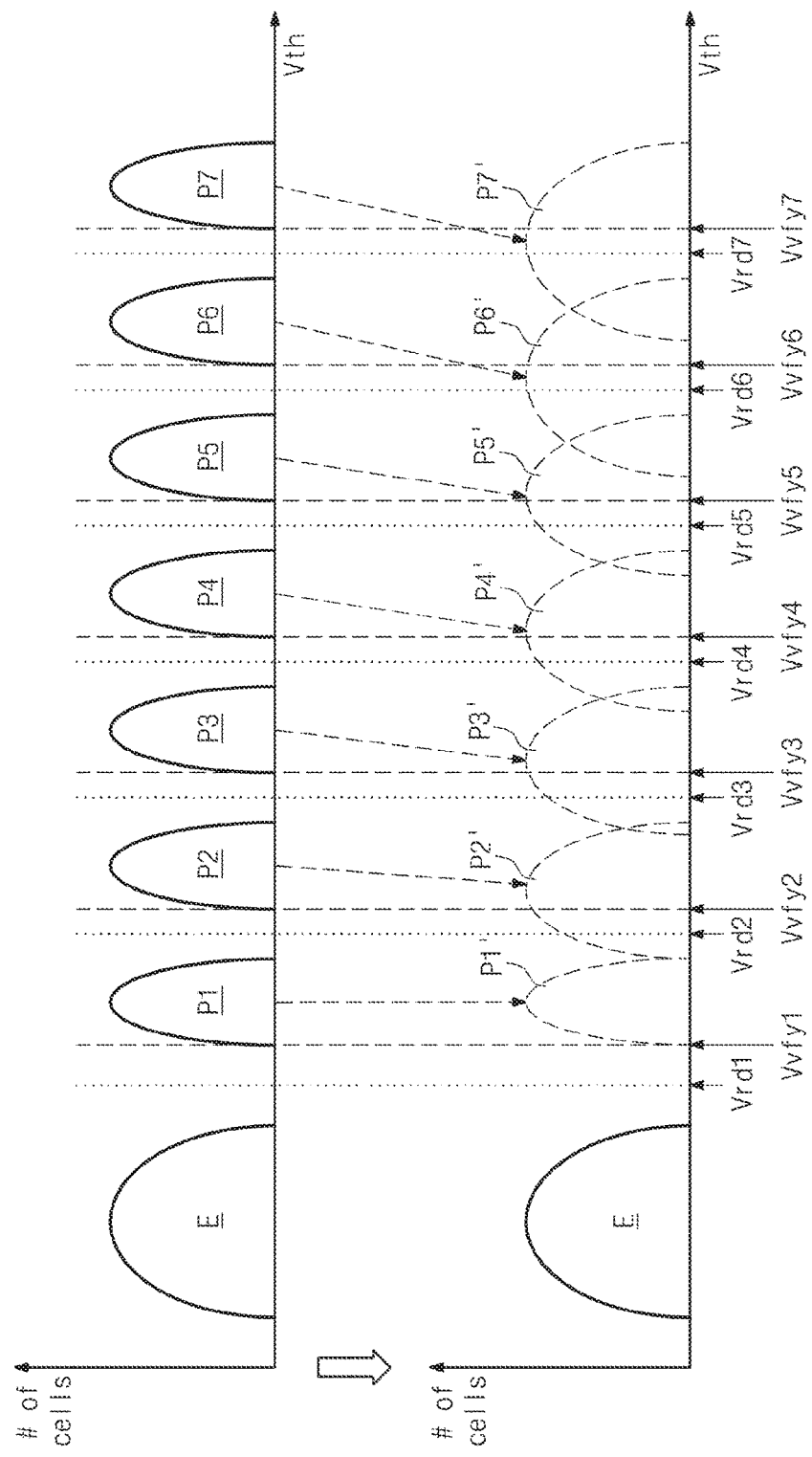
FIG. 5 is a diagram showing examples of threshold voltage distributions of memory cells shown in FIG. 4.

FIG. 5 is a diagram showing examples of threshold voltage distributions of memory cells shown in FIG. 4. Here, a IVS (Initial Verify Shift) will be described with reference to FIG. 5. For ease of description, it is assumed that memory cells included in a nonvolatile memory device 120 are triple level cells (TLCs) each storing three bits. However, the inventive concepts are not limited thereto. For example, each memory cell may be a single level cell (SLC) storing one bit or a multi-level cell (MLC) storing two bits or four or more bits. Also, an operating mode of each memory cell may be variably switched into SLC or MLC.

Referring to FIGS. 4 and 5, memory cells are programmed to have one of an erase state E and first to seventh program states P1 to P7. For example, memory cells are programmed to have one of the erase state E and the first to seventh program states P1 to P7, based on first to seventh verification voltages Vvfy1 to Vvfy7.

Threshold voltages of memory cells may vary as time elapses after the memory cells are programmed. For example, memory cells that are programmed to have the seventh program state P7 may redistribute to form a program state P7' as time elapses after the memory cells are programmed. For example, threshold voltages of the memory cells that are programmed to have the seventh program state P7 are higher than the seventh verification voltage Vvfy7. The threshold voltages of memory cells programmed to have the seventh program state P7 may become lower than the seventh verification voltage Vvfy7 as time elapses Thus, the threshold voltages of memory cells programmed to have the seventh program state P7 may form the program state P7' as time elapses. Likewise, the first to sixth program states P1 to P6 may shift into program states P1' to P6' in the same way as time elapses. That is, threshold voltages of memory cells decrease because charge stored in the charge storage layer of each memory cell moves into a channel layer as time elapses. This physical characteristic of memory cells is referred to as initial verify shift (IVS). For ease of description, it will be assumed that "charge loss" indicates a variation in a threshold voltage of each memory cell due to the IVS. That is, the charge loss may represent a variation in a threshold voltage or a variation in charge moving from a charge storage layer to a channel layer.

An error may be included in data that is read from memory cells of which the threshold voltages vary due to the IVS. For example, a nonvolatile memory device 120 may sense program states P1 to P7 of memory cells using first to seventh selection read voltages Vrd1 to Vrd7. After a time elapses, the program states P1 to P7 shift into program states P1' to P7' due to the IVS. If a read operation is performed using the first to seventh selection read voltages Vrd1 to Vrd7b under the above-described condition, read data may include an error. In this case, the error in read data is uncorrectable error by an error correction code engine (not shown).

To inhibit the occurrence of the above-described problem, a memory controller 110 may store and manage program time information at a first time table PTS1, and detect a program elapsed time based on the first time table PTS1 and a timer 111. In addition, the memory controller 110 may adjust selection read voltages of the nonvolatile memory device 120 based on the program elapsed time, thereby making it possible to prevent or minimize errors due to the IVS.

As described with reference to FIG. 1, the timer 111 may count a clock to generate a current time. If a nonvolatile memory system 100 or a memory controller 110 is powered off, the timer 111 is reset or does not detect a power-off elapsed time. That is, when the nonvolatile memory system 100 is powered-off and then powered-on, the memory controller 110 does not generate the current time.

Figure 6:
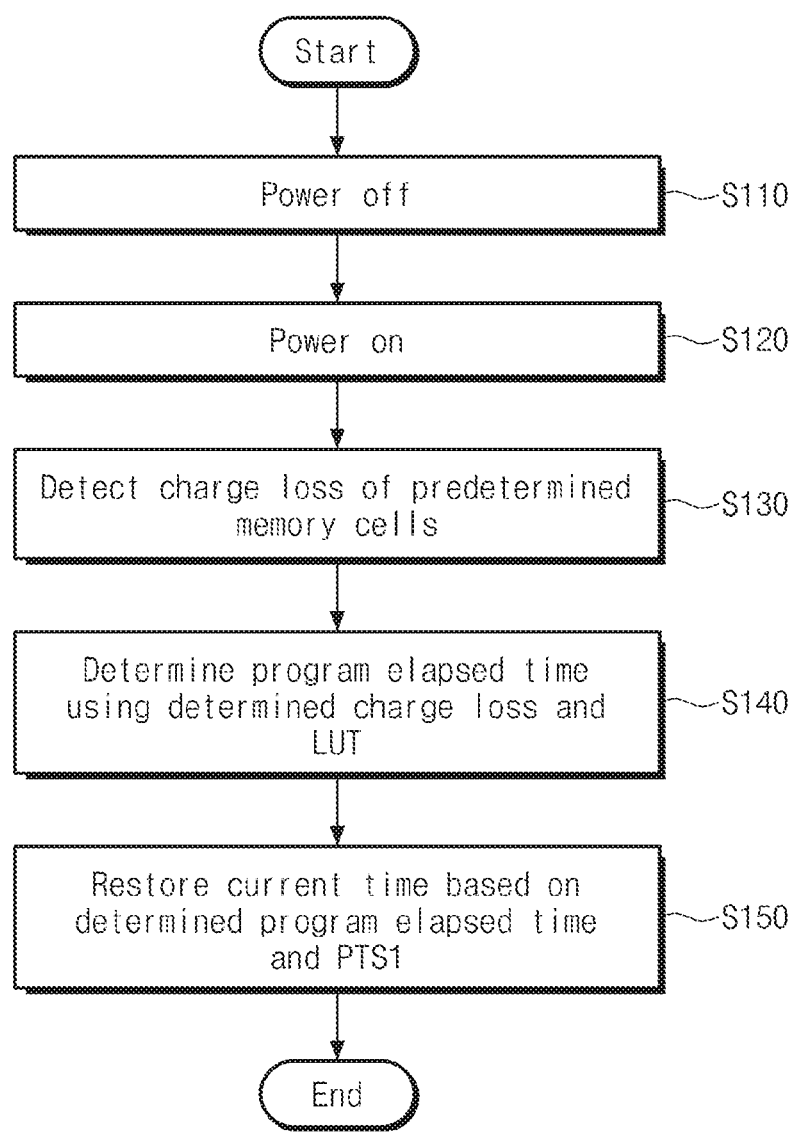
FIG. 6 is a flow chart schematically illustrating an example of an operating method of a memory controller shown in FIG. 1.

FIG. 6 is a flow chart schematically illustrating an example of an operating method of a memory controller shown in FIG. 1. Referring to FIGS. 1 and 6, in step S110, a memory controller 110 is powered off. At this time, the memory controller 110 may perform a normal power-off operation at a normal power-off state (i.e., in contrast to a sudden power-off state). The normal power-off operation may be an operation in which meta data (e.g., mapping tables, time tables, and so on) stored in a buffer memory is flushed into a nonvolatile memory device 120 for normally termination of the memory controller 110.

In step S120, the memory controller 110 is powered on. For example, the nonvolatile memory system 100 may be again powered on when a certain time (e.g., a power-off elapsed time) elapses after the nonvolatile memory system 100 is powered off.

In step S130, the memory controller 110 may detect charge loss of predetermined memory cells (or, specific memory cells). For example, the predetermined memory cells may be memory cells that are programmed just before the nonvolatile memory system 100 is powered off (or, most recently programmed). Alternatively, the predetermined memory cells may be memory cells that are connected to a given wordline, for example, a wordline programmed just before the nonvolatile memory system 100 is powered off (or, most recently programmed). Alternatively, the predetermined memory cells may be memory cells that are connected to at least two given wordlines.

In exemplary embodiments, the memory controller 110 may detect the charge loss, based on schemes such as counting on cells or off cells, measuring a lower value, a valley value, a peak value, and so on. Examples of schemes for detecting the charge loss will be more fully described with reference to FIGS. 8 to 11.

In step S140, the memory controller 110 determines a program elapsed time of the predetermined memory cells using the charge loss thus detected and an LUT 113.

For example, the LUT 113 contains information on charge loss to a program elapsed time. The memory controller 110 determines a program elapsed time of the predetermined memory cells using the detected charge loss and the LUT 113. In exemplary embodiments, the program elapsed time may mean a time from a point in time when the predetermined memory cells are programmed to a current time (i.e., at a power-off).

In step S150, the memory controller 110 restores a current time based on the determined program elapsed time and the first time table PTS1. For example, the first time table PTS1 may include program time information of the predetermined memory cells. The memory controller 110 may restore the current time by adding the determined program elapsed time to the program time information of the predetermined memory cells stored in the first time table PTS1.

In exemplary embodiments, when the nonvolatile memory system 100 is powered on, the memory controller 110 reads a second time table PTS2 from the nonvolatile memory device 120 and stores the second time table PTS2 in an SRAM 115 as the first time table PTS1.

According to above described embodiments of the inventive concepts, it is possible to restore a current time using a charge loss of predetermined memory cells when the nonvolatile memory system 100 is powered-on or reset. Accordingly, an error due to IVS is reduced because the memory controller 110 checks a program elapsed time of memory cells based on the restored current time. Thus, it is possible to provide a memory controller with improved reliability.

Figure 7:
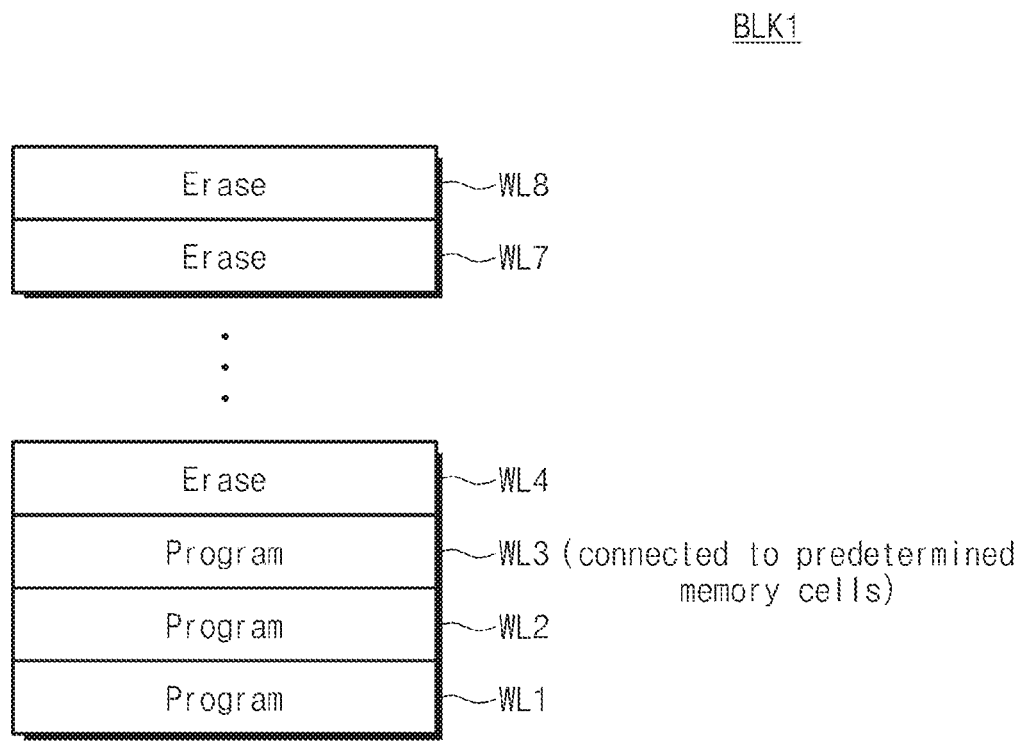
FIG. 7 is a diagram for reference in describing step S130 shown in FIG. 6.

FIG. 7 is a diagram for reference in describing step S130 shown in FIG. 6. For ease of description, a first memory block BLK1 of a plurality of memory blocks included in a memory cell array 121 is illustrated in FIG. 7. Also, it will be assumed that the first memory block BLK1 includes memory cells programmed just before a nonvolatile memory system 100 is powered off (or, most recently programmed). However, the inventive concepts are not limited thereto.

Referring to FIGS. 1 and 7, the first memory block BLK1 may be connected to first to eighth wordlines WL1 to WL8. As described with reference to FIG. 4, the first to eighth wordlines WL1 to WL8 may be connected to a plurality of memory cells. The nonvolatile memory system 100 may program data at the first memory block BLK1. At this time, the programmed data may be user data. Alternatively, the programmed data may include user data and spare data.

The nonvolatile memory system 100 programs data by the page unit. For example, the nonvolatile memory system 100 may perform program operations sequentially from memory cells connected to the first wordline WL1 to memory cells connected to the eighth wordline WL8. The nonvolatile memory system 100 may perform the program operation based on any of a variety of programming schemes such as high-speed programming (HIP), one-shot programming, shadow programming, reprogramming, and so on.

In FIG. 7, memory cells connected to the third wordline WL3 may be memory cells most recently programmed before the nonvolatile memory system 100 is powered off. At this time, a memory controller 110 may decide the memory cells connected to the third wordline WL3 as predetermined memory cells (or, specific memory cells).

FIGS. 8 to 11 are diagrams for reference in describing examples of step S130 of FIG. 6 in further detail. For example, a method of counting on cells/off cells will be described with reference to FIG. 8, a method of measuring a lower value will be described with reference to FIG. 9, a method of measuring a peak value will be described with reference to FIG. 10, and a method of measuring a valley value will be described with reference to FIG. 11.

Figure 8:
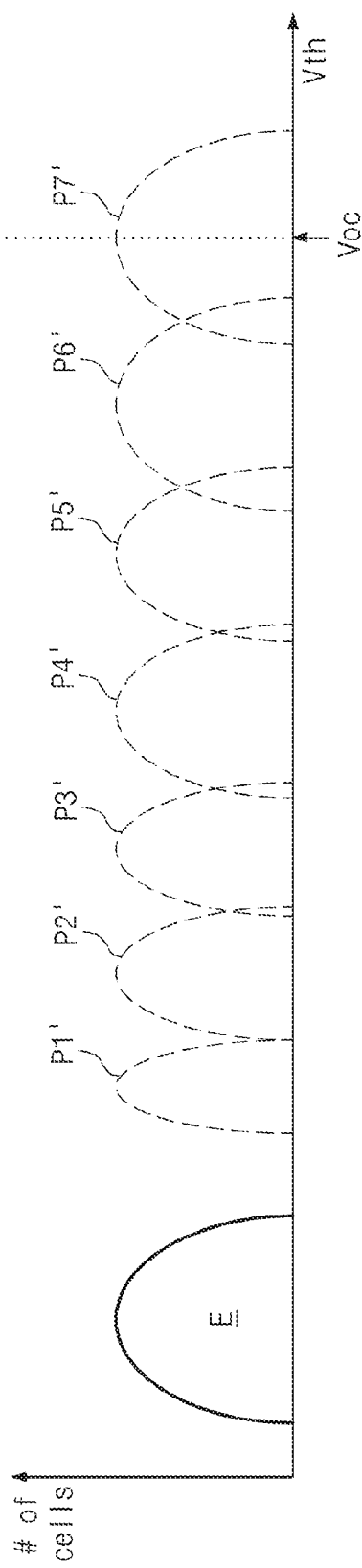
FIGS. 8, 9, 10 and 11 are diagrams for reference in describing step S130 shown in FIG. 6 in further detail.

Referring to FIGS. 1, 7, and 8, after power is supplied, a memory controller 110 detects charge loss of predetermined memory cells. For example, as described with reference to FIG. 7, the predetermined memory cells may be memory cells connected to a third wordline WL3. When a nonvolatile memory system 100 is powered on, each of memory cells connected to the third wordline WL3 may have one of program states P1' to P7'.

The memory controller 110 performs an on-cell/off-cell counting operation for the predetermined memory cells. For example, the memory controller 110 reads the predetermined memory cells once based on a reference voltage Voc. The reference voltage Voc may be a read voltage for the on-cell/off-cell counting operation. The memory controller 110 detects the number of memory cells (i.e., on cells) each having a threshold voltage lower than the reference voltage Voc. Alternatively, the memory controller 110 detects the number of memory cells (i.e., off cells) each having a threshold voltage higher than the reference voltage Voc.

In exemplary embodiments, the reference voltage Voc may be higher than a lower value of a threshold voltage distribution corresponding to a seventh program state P7 (refer to FIG. 5) and higher than an upper value of a threshold voltage distribution corresponding to a sixth program state P6. However, the inventive concepts are not limited thereto. For example, the reference voltage Voc may be included in a range of threshold voltage distributions corresponding to a plurality of program states.

The memory controller 110 may detect charge loss based on the number of on cells/off cells thus detected. For example, the charge loss becomes greater as the number of on cells increases. Likewise, the charge loss becomes greater as the number of off cells decreases. The memory controller 110 may include an on-cell to charge loss lookup table (not shown) in which there is stored information on charge loss to the number of on cells/off cells. The memory controller 110 may detect the charge loss based on the on-cell to charge loss lookup table.

Figure 9:
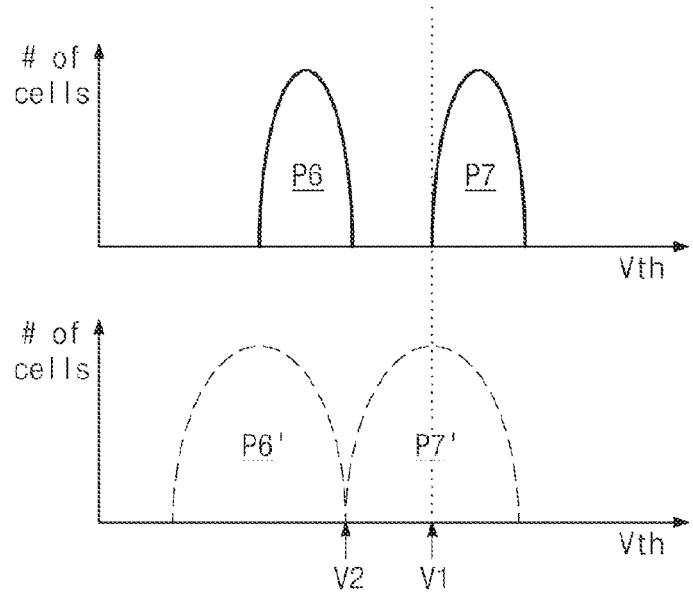

Referring to FIGS. 1, 7, and 9, after power is restored, the memory controller 110 detects the charge loss of the predetermined memory cells. For example, the memory controller 110 detects a difference between lower values of threshold voltage distributions corresponding to seventh program states P7 and P7'. Herein, the seventh program state P7' may be a program state after a power is turned on. For example, a lower value of a threshold voltage distribution of the seventh program state P7 may be a first value V1, and a lower value of a threshold voltage distribution of the seventh program state P7' may be a second value V2. The memory controller 110 decides a difference (V1–V2) between the first and second values V1 and V2 as the charge loss.

For example, the lower value of a threshold voltage distribution of the seventh program state P7 may be a seventh verification voltage Vvfy7 (refer to FIG. 5) for verifying the seventh program state P7. For example, the memory controller 110 reads predetermined memory cells n times (n being a natural number) to detect a lower value of a threshold voltage distribution of the program state P7'.

To detect a lower value of a threshold voltage distribution of the seventh program state P7 is described with reference to FIG. 9. However, the inventive concepts are not limited thereto. For example, it is well understood that the inventive concepts are applicable to detect lower values of other program states.

Figure 10:
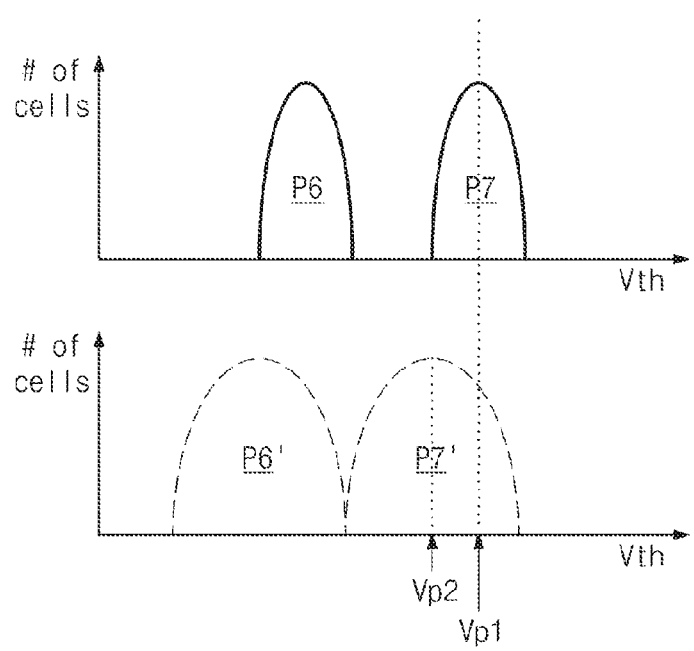

Referring to FIGS. 1, 7, and 10, after power is restored, the memory controller 110 detects the charge loss of the predetermined memory cells. For example, the memory controller 110 detects a difference between peak values of seventh program states P7 and P7'. Herein, the seventh program state P7' may be a program state after a power is turned on. For example, a peak value of the seventh program state P7 may be a first peak value Vp1, and a peak value of the seventh program state P7' may be a second peak value Vp2. The memory controller 110 decides a difference (Vp1–Vp2) between the first and second peak values V1 and V2 as the charge loss.

Figure 11:
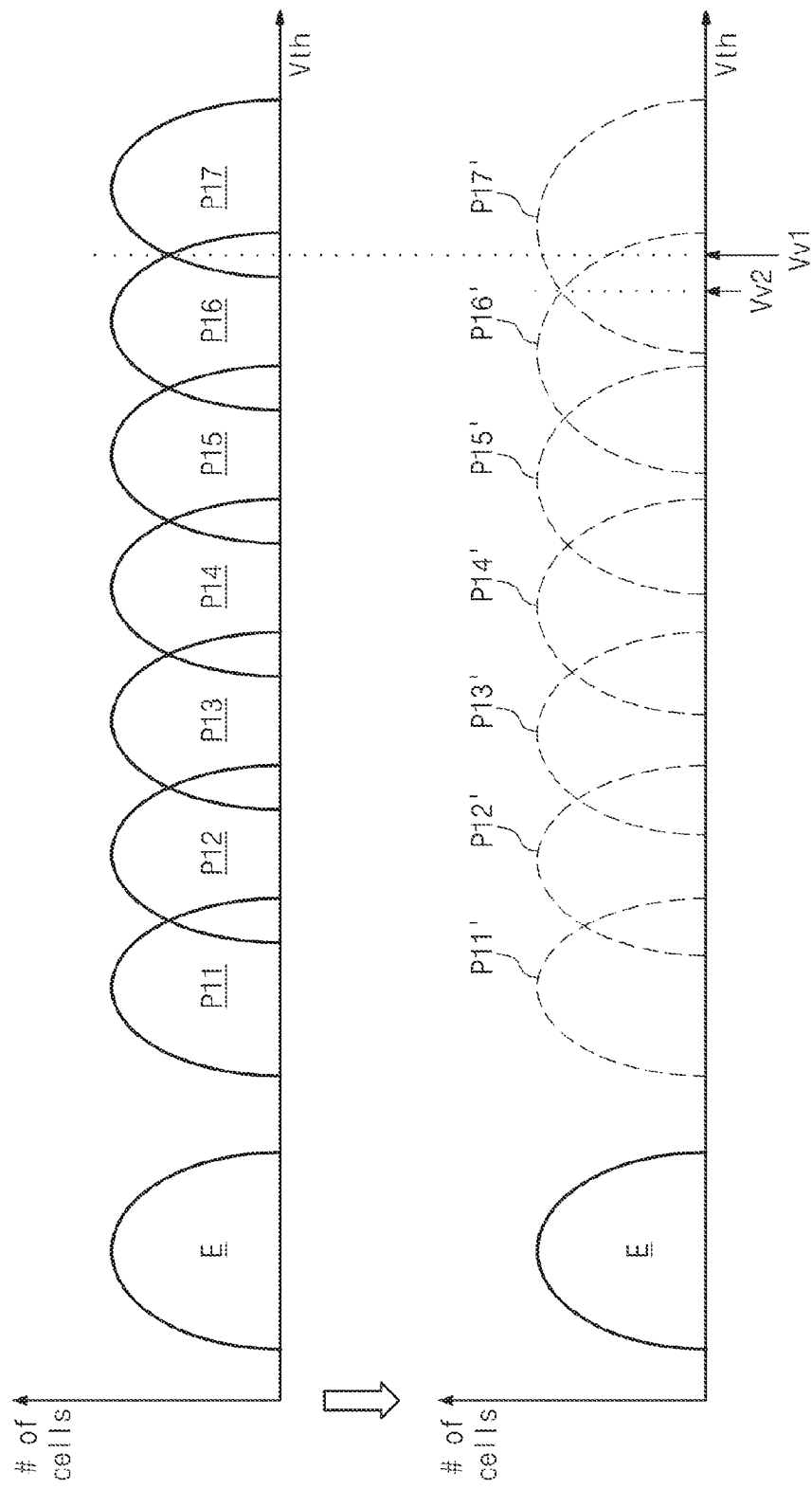

Referring to FIGS. 1, 7, and 11, after powered on, the memory controller 110 detects the charge loss of the predetermined memory cells. For example, the predetermined memory cells may have threshold voltage distributions illustrated in FIG. 11. Unlike ideal program states P1 to P7, program states P11 to P17 illustrated in FIG. 11 may correspond to actual threshold voltage distributions of memory cells.

The memory controller 110 detects valley values about the sixth and seventh program states P6 and P7. A valley value between the sixth and seventh program states P16 and P17 about the predetermined memory cells may be a first valley value Vv1. Afterwards, the memory controller 110 detects a valley value between the sixth and seventh program states P16' and P17' about the predetermined memory cells after a time elapses (i.e., after a power is turned on). A valley value between the sixth and seventh program states P16' and P17' about the predetermined memory cells may be a second valley value Vv2. The second valley value Vv2 may be lower than the first valley value Vv1 because threshold voltages of the predetermined memory cells are varied as time elapses. The memory controller 110 decides a difference (Vv1–Vv2) between the first and second valley values Vv1 and Vv2 as the charge loss.

As described with reference to FIGS. 8 to 11, the memory controller 110 may detect charge loss about predetermined memory cells, based on various schemes such as counting on cells/off cells, detecting a lower value, a valley value or a peak value, and so on. However, the inventive concepts are not limited thereto. Detecting charge loss of predetermined memory cells may be variously modified or changed.

In exemplary embodiments, the memory controller 110 may read predetermined memory cells n times (n being a natural number) to perform a detection operation, such as detecting a lower value, a valley value, a peak value, and so on. A read operation of the memory controller 110 that is performed for the above-described detection operations may differ from a normal read operation. For example, read voltages for reading data stored in a nonvolatile memory device 120 to perform the above-described detection operations may be different from those for the normal read operation.

FIG. 12 is a diagram schematically illustrating an example of the LUT shown in FIG. 1. Step S130 shown in FIG. 6 will be described with reference to FIG. 12. Referring to FIGS. 1, 6, and 12, LUT 113 includes information on charge loss to a program elapsed time T_pe. For example, the LUT 113 includes information on a plurality of charge losses CL1 to CLn and a plurality of program elapsed times T_pe1 to T_pen. A memory controller 110 may detect charge loss CL of predetermined memory cells based on methods described with reference to FIGS. 8 to 11. If detected charge loss CL is first charge loss CL1, the memory controller 110 selects a first program elapsed time T_pe1 as a program elapsed time. If detected charge loss CL is second charge loss CL2, the memory controller 110 selects a second program elapsed time T_pe2 as a program elapsed time.

In other words, in a case where a variation in threshold voltages of the predetermined memory cells is about 40 mV, the program elapsed time may be about 100 sec. Likewise, in a case where a variation in threshold voltages of the predetermined memory cells is about 80 mV, the program elapsed time may be about 1000 sec. Values illustrated in FIG. 11 may be exemplary, and the inventive concepts are not limited thereto. Values of program elapsed times and charge losses included in the LUT 113 may be variously changed in accordance to characteristics of memory cells.

In exemplary embodiments, the memory controller 110 may restore a current time of a timer 111 based on a detected program elapsed time and program time information of predetermined memory cells.

According to above described embodiments of the inventive concepts, when powered on, the memory controller 110 may detect charge loss of predetermined memory cells (i.e., memory cells just before a power is turned off or memory cells most recently programmed) and restore a current time based on the detected charge loss. Thus, a memory controller with improved reliability may be realized.

Figure 13:
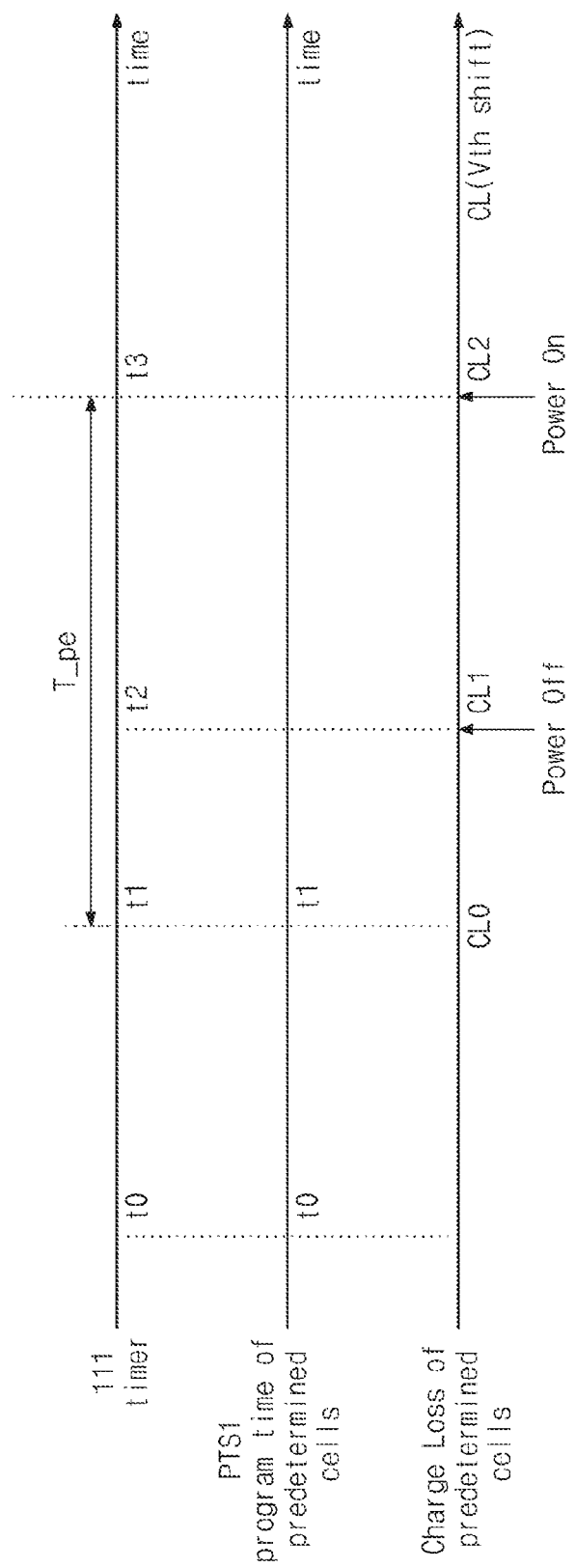
FIG. 13 is a timing diagram for describing an operational example of a memory controller shown in FIG. 1.

FIG. 13 is a timing diagram for reference in describing an operational example of a memory controller shown in FIG. 1. Referring to FIGS. 1 and 13, a timer 111 generates a current time. For example, the timer 111 counts a clock from t0 to generate a current time. Predetermined memory cells are programmed at t1. As described above, the predetermined memory cells may be memory cells storing user data. The predetermined memory cells may be memory cells that are programmed (or, most recently programmed) just before power-off.

A first time table PTS1 includes time information of t1 when the predetermined memory cells are programmed. Charge loss of the predetermined memory cells at t1 is CL0 (i.e., "0"). A nonvolatile memory system 100 is powered off at t2. A power is again supplied to the nonvolatile memory system 100 at t3. Resetting or not counting a clock during power-off, the timer 111 does not generate an accurate time of t3.

According to above described embodiments of the inventive concepts, a memory controller 111 may detect charge loss CL3 of the predetermined memory cells at t3 when a power is supplied. The memory controller 110 may detect a program elapsed time T_pe from t1 (i.e., a point in time when the predetermined memory cells are programmed), based on the detected charge loss CL3 and LUT 113. The memory controller 110 may restore an accurate current time at t3 (i.e. a current time), based on the detected program elapsed time T_pe and a first time table PTS1.

Figure 14:
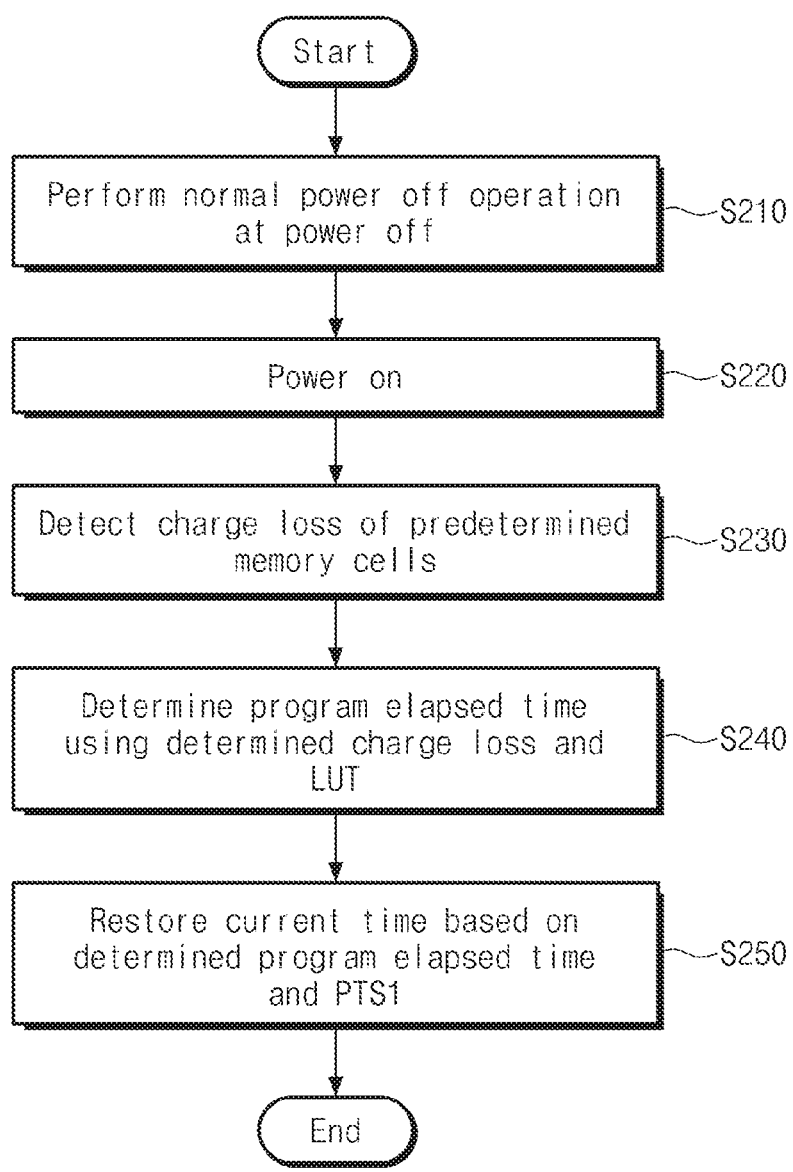
FIG. 14 is a flow chart schematically illustrating an operation of a memory controller, according to another embodiment of the inventive concept.

FIG. 14 is a flow chart schematically illustrating an example of an operation of a memory controller, according to another embodiment of the inventive concepts. Referring to FIGS. 1 and 14, in step S210, a memory controller 110 performs a normal power-off operation at power-off. For example, at power-off, the memory controller 110 may flush information stored in an SRAM 114 into a nonvolatile memory device 120, i.e., the information such as a mapping table, a first time table PTS1, and so on. For example, the memory controller 110 may program dummy data at predetermined memory cells (or, specific memory cells) during a normal power-off operation. In exemplary embodiments, the predetermined memory cells (or, specific memory cells) may include memory cells connected to a predetermined wordline (or, specific wordline), which is included in a predetermined memory block (or, specific memory block). In other exemplary embodiments, the predetermined wordline and memory block may be the wordline and memory block that are predetermined considering their locations, their physical characteristics, their number of program/erase cycles and so on.

In exemplary embodiments, after programming dummy data, the memory controller 110 may check characteristics of predetermined memory cells where the dummy data is stored. Examples of such characteristics include the number of on cells, the number of off cells, a lower value of a threshold voltage distribution, a valley value, and/or a peak value. The checked information may be stored at a meta area of the nonvolatile memory device 120. At power-on, the memory controller 110 detects charge loss, based on characteristics of memory cells stored at the meta area. For example, the memory controller 110 compares a characteristic of memory cells stored at the meta area and a characteristic of memory cells after powered on, to detect charge loss.

For ease of description, it will be assumed that predetermined memory cells are memory cells connected to a predetermined wordline. However, the inventive concepts are not limited thereto. For example, predetermined memory cells may be memory cells included in a predetermined memory block or memory cells included in a predetermined page (i.e., memory cells, connected to a predetermined wordline, from among memory cells included in cell strings connected to a predetermined string selection line).

Steps S220 to S250 are substantially the same as steps S120 to S150 shown in previously described FIG. 6, and a description thereof is thus omitted.

With the above description, the memory controller 110 may perform a normal power-off operation at power-off. At the power-off, the memory controller 110 may program dummy data at predetermined memory cells (i.e., memory cells connected to a predetermined wordline). When a nonvolatile memory system 100 is powered on, the memory controller 110 may detect charge loss of predetermined memory cells and restore a current time of a timer 111 based on the detected charge loss. In exemplary embodiments, the memory controller 110 may compare a characteristic of predetermined memory cells checked at the normal power-off operation and a characteristic of the predetermined memory cells after powered on, to detect charge loss.

Figure 15:
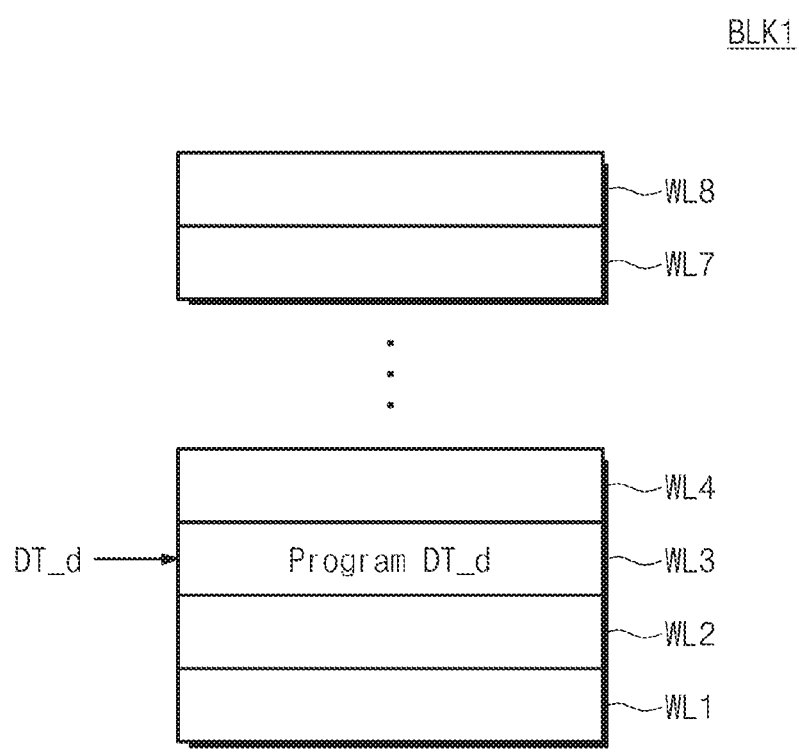
FIG. 15 is a block diagram for reference in describing step S210 shown in FIG. 14.

FIG. 15 is a block diagram for describing step S210 shown in FIG. 14. Referring to FIGS. 1, 14, and 15, a nonvolatile memory system 100 may be powered off. At this time, a memory controller 110 may perform a normal power-off operation. In exemplary embodiments, the memory controller 110 may write dummy data DT_d at predetermined memory cells. The dummy data DT_d may be data that is programmed to detect charge loss of predetermined memory cells at power-on.

As illustrated in FIG. 15, the predetermined memory cells may be memory cells that are connected to a third wordline WL3 of a first memory block BLK1. That is, the third wordline WL3 may be a predetermined wordline. The memory controller 110 may program the dummy data DT_d at the predetermined memory cells during the normal power-off operation. For example, the first memory block BLK1 may be a user block. Alternatively, the first memory block BLK1 may be a dummy block that is assigned to write the dummy data DT_d.

Although not shown in figures, the predetermined memory cells may be a part of memory cells connected to the third wordline WL3. That is, the dummy data DT_d and the predetermined memory cells may be set by the page unit.

An embodiment of the inventive concepts is exemplified as the predetermined memory cells are connected to the third wordline WL3. However, the inventive concepts are not limited thereto.

Figure 16:
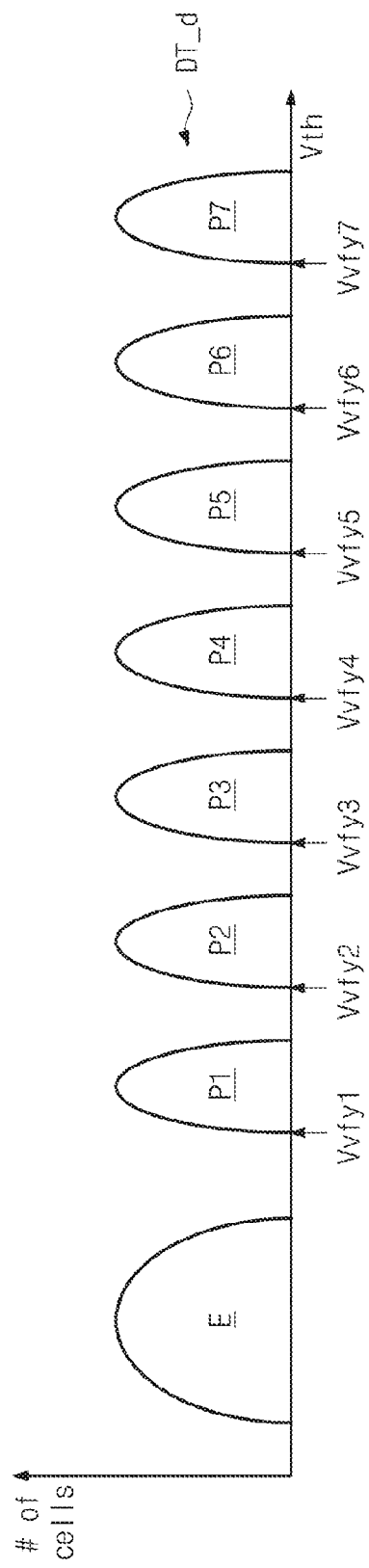
FIGS. 16, 17 and 18 are diagrams for describing an example of dummy data illustrated in FIG. 15.
Figure 17:
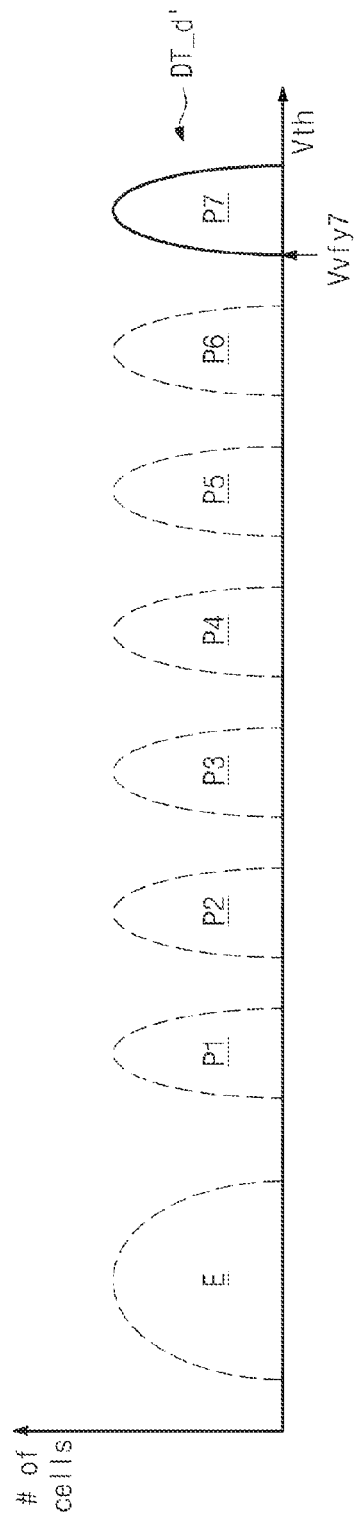
Figure 18:
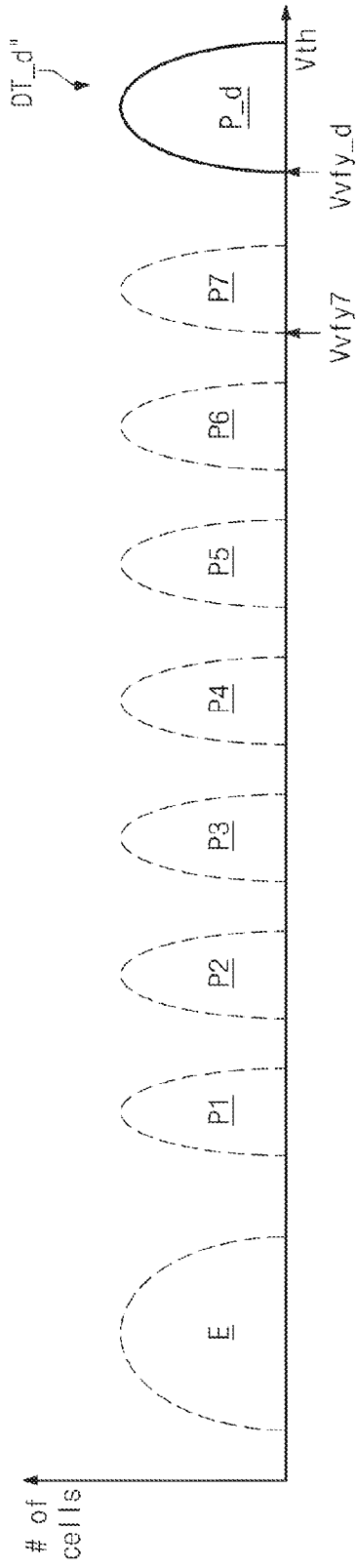

FIGS. 16 to 18 are diagrams for describing examples of dummy data illustrated in FIG. 15. Referring to FIGS. 15 and 16, predetermined memory cells (i.e., memory cells connected to a third wordline WL3) are programmed to have one of an erase state E and a plurality of program states P1 to P7 based on dummy data DT_d. For example, the predetermined memory cells may be programmed to have one of the erase state E and the program states P1 to P7, based on first to seventh verification voltages Vvfy1 to Vvfy7.

In this case, each of the erase state E and program states P1 to P7 may include the same number of memory cells. For example, the number of memory cells each having the erase state E, the number of memory cells each having the first program state P1, the number of memory cells each having the second program state P2, the number of memory cells each having the third program state P3, the number of memory cells each having the fourth program state P4, the number of memory cells each having the fifth program state P5, the number of memory cells each having the sixth program state P6, and the number of memory cells each having the seventh program state P7 are equal to one another. That is, the dummy data DT_d may be decided such that each of the erase and program states includes the same number of memory cells. In exemplary embodiments, the dummy data DT_d is data that is randomized by the memory controller 110.

At power-on, a memory controller 110 may detect charge loss of the predetermined memory cells programmed as described above and restore a current time based on the detected charge loss.

Referring to FIGS. 15 and 17, the predetermined memory cells are programmed to have the seventh program state P7 based on dummy data DT_d'. In other words, the predetermined memory cells are programmed to the uppermost program state (e.g., a program state with the highest threshold voltage) of a plurality of program states P1 to P7. The dummy data DT_d' may be decided such that the predetermined memory cells have the uppermost program state. The predetermined memory cells may be programmed with the dummy data DT_d' using a seventh verification voltage Vvfy7.

In exemplary embodiments, a variation in a threshold voltage due to IVS may increase with an increase in threshold voltages of the predetermined memory cells. If a variation in threshold voltages of the predetermined memory cells increases, an error of charge loss detected or an error of a restored current time decreases. In other words, the memory controller 110 decides dummy data such that the predetermined memory cells have the uppermost program state, thereby reducing an error of the restored current time.

Referring to FIGS. 1, 15, and 18, the memory controller 110 programs predetermined memory cells to a dummy program state P_d at a normal power-off operation. For example, a seventh verification voltage Vvfy7 may be a voltage that is used to verify a seventh program state P7 (i.e., the uppermost program state). The predetermined memory cells are programmed using a dummy verification voltage Vvfy_d higher than the seventh verification voltage Vvfy7. In exemplary embodiments, the program state P_d may be higher than the seventh program state P7. That is, threshold voltages of memory cells having the program state P_d may be higher than those of memory cells having the program states P1 to P7. In other words, the dummy data DT_d" may be decided such that the predetermined memory cells are programmed to the program state P_d to have threshold voltages higher than that of memory cells having the program states P1 to P7.

That is, an error of charge loss of the predetermined memory cells and an error of a restored current time may be reduced when a power is turned on, because the predetermined memory cells are programmed to the program state P_d.

Figure 19:
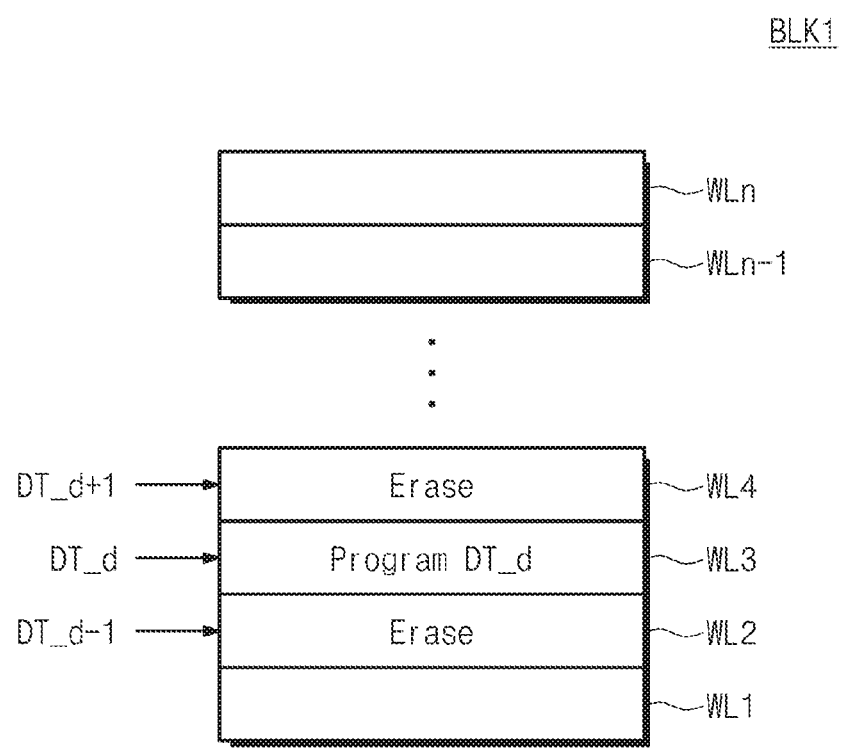
FIGS. 19 and 20 are block diagrams schematically illustrating an example of a dummy data programming method shown in FIG. 15.
Figure 20:
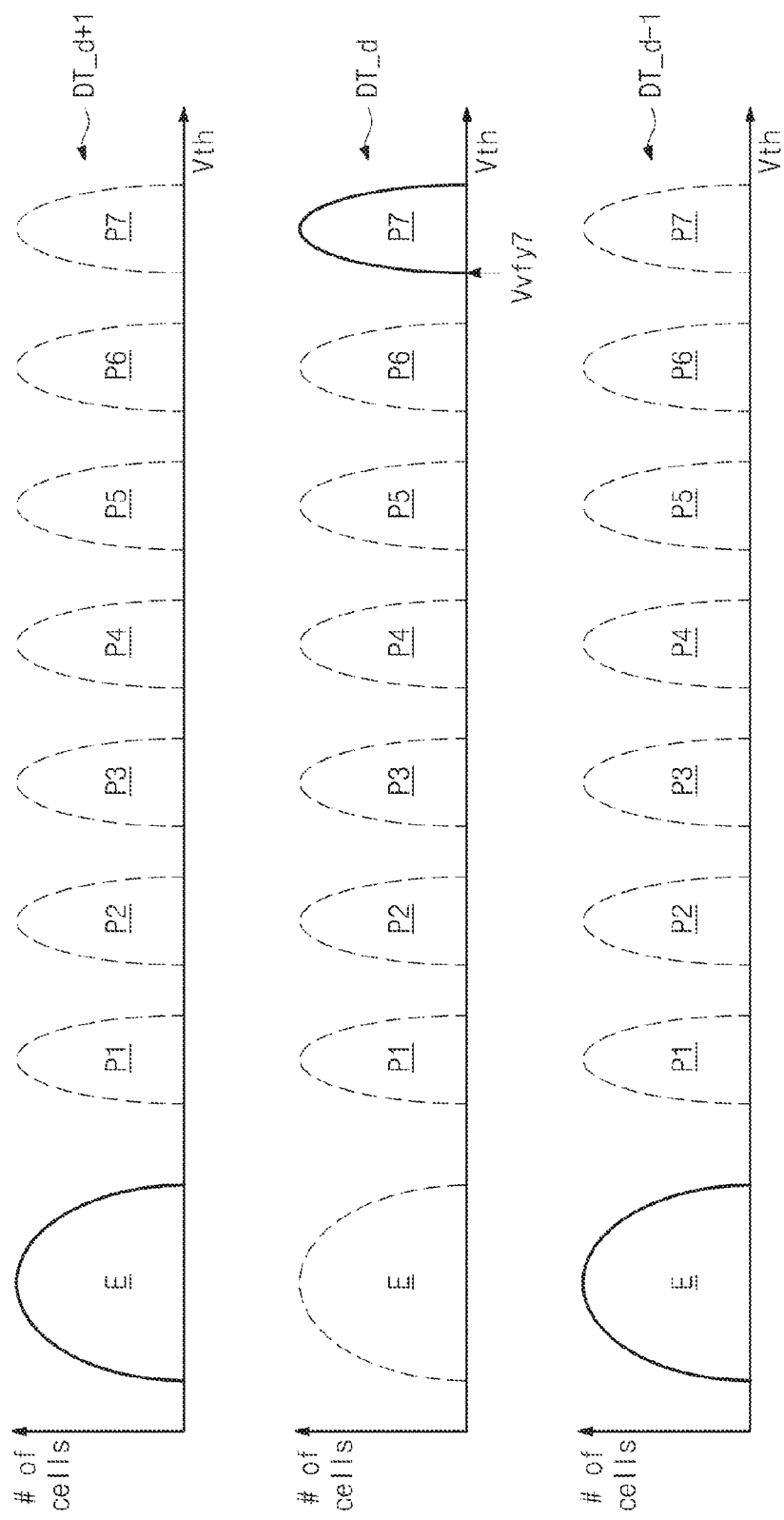

FIGS. 19 and 20 are block diagrams schematically illustrating another embodiment of a dummy data programming method shown in FIG. 15. Referring to FIGS. 1, 15, 19, and 20, a memory controller 110 may write dummy data DT_d at predetermined memory cells during a normal power-off operation. That is, as illustrated in FIG. 19, the memory controller 110 programs memory cells, connected to a third wordline WL3, to a seventh program state P7. For example, the memory controller 110 programs the memory cells connected to the third wordline WL3, based on a seventh verification voltage Vvfy7. In exemplary embodiments, the dummy data DT_d is not limited to dummy data DT_d illustrated in FIG. 19. For example, the dummy data DT_d may be variously changed to types of dummy data DT_d, DT_d', DT_d" described with reference to FIGS. 15 to 17.

In exemplary embodiments, the predetermined memory cells may be memory cells that are connected to a third wordline WL3. Alternatively, the predetermined memory cells may be a part of the memory cells that are connected to the third wordline WL3. The predetermined memory cells may not be limited to the memory cells that are connected to the third wordline WL3, and they may be variously changed according to characteristics of memory cells, locations of wordlines, and so on.

The memory controller 110 programs upper dummy data DT_d+1 and lower dummy data DT_d−1 at wordlines adjacent to a predetermined wordline (i.e., a wordline connected to predetermined memory cells or a predetermined page). For example, the predetermined memory cells may be memory cells connected to the third wordline WL3. The memory controller 110 programs dummy data DT_d at memory cells connected to the third wordline WL3. The memory controller 110 programs the upper dummy data DT_d+1 at an upper wordline (e.g., WL4) adjacent to the third wordline WL3. The memory controller 110 programs the upper dummy data DT_d−1 at a lower wordline (e.g., WL2) adjacent to the third wordline WL3.

In exemplary embodiments, the upper wordline may represent a wordline, relatively closer to a string selection line, from among wordlines adjacent to a predetermined wordline, and the lower wordline may represent a wordline, relatively closer to a ground selection line, from among the wordlines adjacent to the predetermined wordline.

As illustrated in FIG. 20, the upper dummy data DT_d+1 and lower dummy data DT_d−1 may include data corresponding to an erase state E. In this case, the memory controller 110 selects a predetermined wordline such that the upper wordline WL4 and the lower wordline WL2 become an erase state. That is, the memory controller 110 selects a predetermined wordline of which the upper and lower wordlines are at an erase state and programs dummy data DT_d at memory cells connected to the selected predetermined wordline. In this case, memory cells connected to the upper and lower wordlines and the predetermined wordline have a threshold voltage distribution illustrated in FIG. 20. In exemplary embodiments, the memory controller 110 does not perform program operation on the upper wordline and lower wordline such that each of memory cells connected to the upper wordline or lower wordline have the erase state E.

Not only does the memory controller 110 program dummy data at predetermined memory cells at a normal power-off operation, but it also programs upper dummy data and lower dummy data at the upper wordline and the lower wordline adjacent to the predetermined wordline. With this programming, charge loss of predetermined memory cells may increase during power-off. Thus, an error of charge loss of the predetermined memory cells and an error of a restored current time are reduced.

Figure 21:
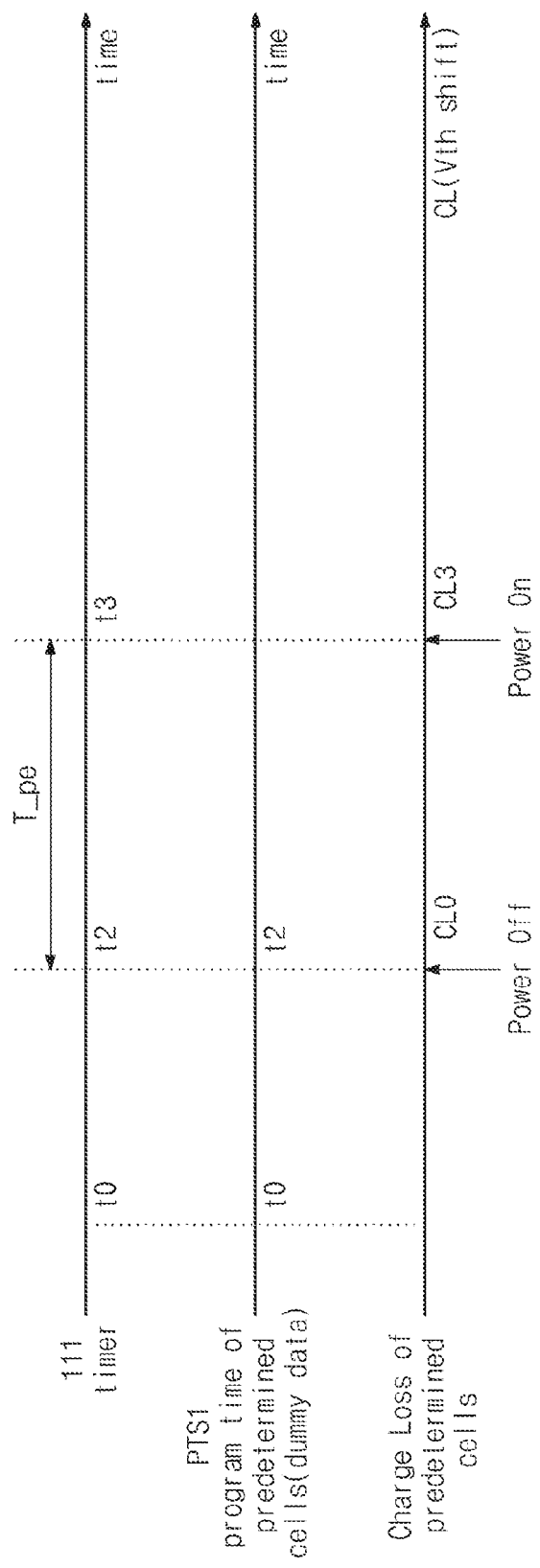
FIG. 21 is a timing diagram for describing an exemplary operation of a memory controller shown in FIG. 14.

FIG. 21 is a timing diagram for describing an example of an operation of a memory controller shown in FIG. 14. Referring to FIGS. 1, 14, and 21, a timer 111 generates a current time. For example, the timer 111 counts a clock from t0 to generate a current time. At t2, a nonvolatile memory system 100 is powered off. At this time, the memory controller 110 performs a normal power-off operation. For example, the memory controller 110 programs dummy data at predetermined memory cells at t2. The memory controller 110 stores information of t2 when dummy data is programmed at a first time table PTS1.

Afterwards, the nonvolatile memory system 100 is powered on at t3. At this time, the memory controller 110 detects charge loss CL3 of the predetermined memory cells and detects a program elapsed time T_pe based on the detected charge loss CL3 and LUT 113. The memory controller 110 restores an accurate current time of t3, based on the detected program elapsed time T_pe and information of t2 stored in the first time table PTS1.

In exemplary embodiments, the program elapsed time T_pe illustrated in FIG. 21 may be equal to a power-off elapsed time.

FIG. 22 is a diagram schematically illustrating an example of a program operation of a nonvolatile memory device shown in FIG. 1. Referring to FIGS. 1 and 22, a first section of FIG. 22 is a graph showing a program operation that is executed in high-speed programming. A second section of FIG. 22 is a graph showing an operation of programming dummy data DT_d (refer to FIG. 16).

Referring to the first section of FIG. 22, a nonvolatile memory device 120 performs a program operation through a plurality of program loops. Each program loop includes a writing step in which a program voltage is applied to a selected wordline, and a verification step in which programmed memory cells are verified. The program voltage applied in the writing step increases by a predetermined level $\Delta$Vpgm1 whenever a program loop is ended. For example, the nonvolatile memory device 120 applies a first start program voltage Vpgm1 to the selected wordline. Afterwards, the nonvolatile memory device 120 sequentially applies first to seventh verification voltages Vvfy1 to Vvfy7 to verify whether selected memory cells connected to the selected wordline are normally programmed. In exemplary embodiments, the first to seventh verification voltages Vvfy1 to Vvfy7 may be voltages for verifying first to seventh program states P1 to P7.

Afterwards, the nonvolatile memory device 120 performs iteratively a program loop until the selected memory cell is program passed.

Referring to the second section of FIG. 22, the nonvolatile memory device 120 programs dummy data DT_d through a plurality of program loops. For example, the dummy data DT_d may be decided such that predetermined memory cells have a seventh program state P7, as illustrated in FIG. 16. The nonvolatile memory device 120 applies a second start program voltage Vpgm2 to a selected wordline which is connected to predetermined memory cells. Afterwards, the nonvolatile memory device 120 applies a seventh verification voltage Vvfy7 to the selected wordline to determine whether the predetermined memory cells are program passed. Afterwards, the nonvolatile memory device 120 performs iteratively a program loop until the predetermined memory cells are program passed.

As described above, the nonvolatile memory device 120 applies the first to seventh verification voltages Vvfy1 to Vvfy7 during a verification step of the high-speed program operation. In contrast, the nonvolatile memory device 120 applies only the seventh verification voltage Vvfy7 during a verification step of a program operation about the dummy data DT_d. Also, the second start program voltage Vpgm2 applied when the dummy data DT_d is programmed is higher than the first start program voltage Vpgm1 applied when the high-speed program operation is performed. Further, an increment $\Delta$Vpgm2 of the second start program voltage Vpgm2 may be greater than that $\Delta$Vpgm1 of the first start program voltage Vpgm1.

The spirit and scope of the inventive concepts are not be limited to the above-described program operations. For example, a verification voltage used when dummy data is programmed may be set to be higher than the seventh verification voltage Vvfy7. Alternatively, a verification voltage used when dummy data is programmed may be replaced with verification voltages different from the seventh verification voltage Vvfy7.

Figure 23:
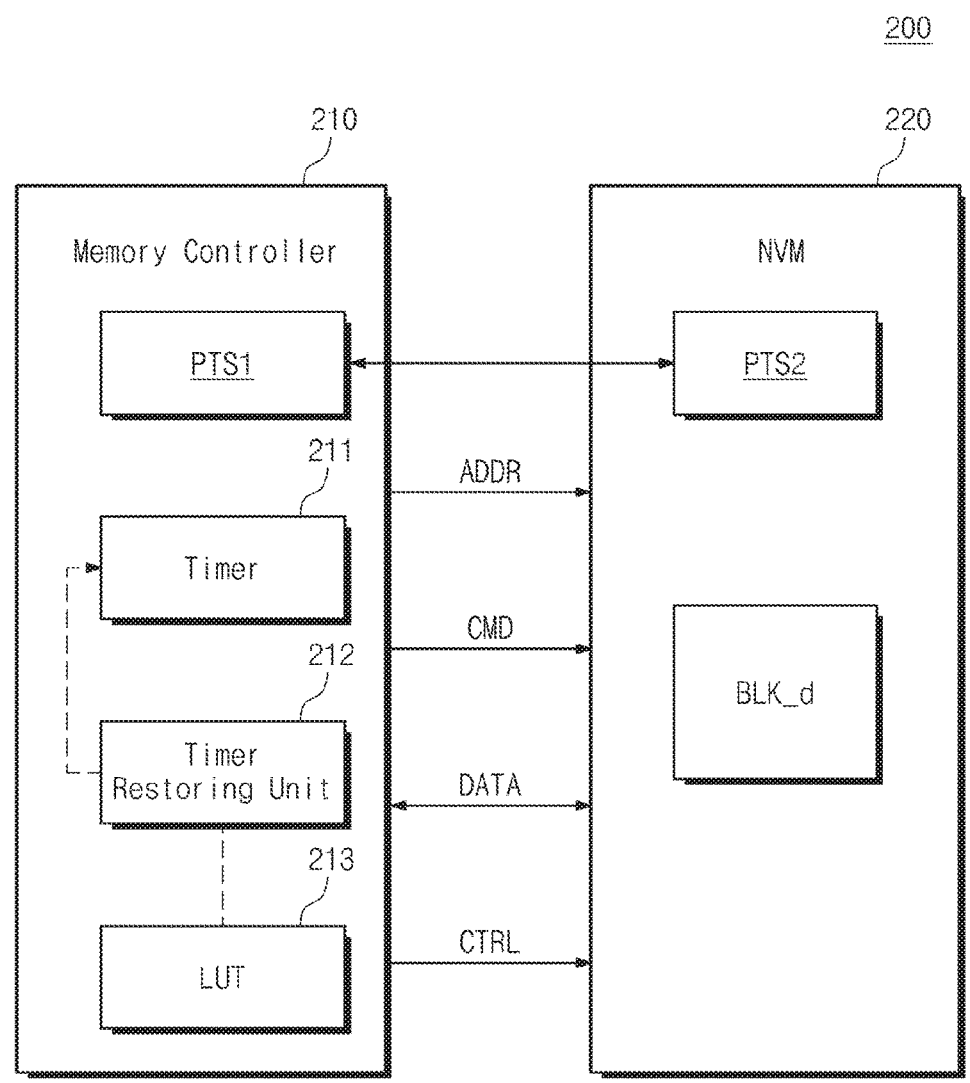
FIG. 23 is a block diagram schematically illustrating a nonvolatile memory system according to another embodiment of the inventive concept.

FIG. 23 is a block diagram schematically illustrating a nonvolatile memory system according to another embodiment of the inventive concepts. Referring to FIG. 23, a nonvolatile memory system 200 contains a memory controller 210 and a nonvolatile memory device 220. The memory controller 210 includes a first time table PTS1, a timer 211, a timer restoring unit 212, and LUT 213. The nonvolatile memory device 220 contains a second time table PTS2 and dummy blocks BLK_d. The memory controller 210 transfers an address ADDR, a command CMD, and a control signal CTRL to the nonvolatile memory device 220. The memory controller 210 exchanges data with the nonvolatile memory device 220.

The first time table PTS1, the timer 211, the timer restoring unit 212, the LUT 213, and the second time table PTS2 are described previously with reference to FIG. 1, their description is omitted.

The nonvolatile memory device 220 illustrated in FIG. 23 differs from the device 120 illustrated in FIG. 1 in that the dummy blocks BLK_d are included. The dummy blocks BLK_d may be memory blocks, predetermined to store dummy data DT_d, from among a plurality of memory blocks included in the nonvolatile memory device 220.

At a normal power-off operation, the memory controller 210 programs dummy data DT_d in at least one of the dummy blocks BLK_d. Afterwards, when a nonvolatile memory system 200 is powered on, the memory controller 210 detects charge loss based on the dummy block BLK_d at which the dummy data DT_d is programmed. The memory controller 210 restores a current time based on the detected charge loss. The memory controller 210 performs a charge loss detecting operation and a current time restoring operation in the same manner as described with reference to FIGS. 1 to 22, and a description thereof is thus omitted.

Figure 24:
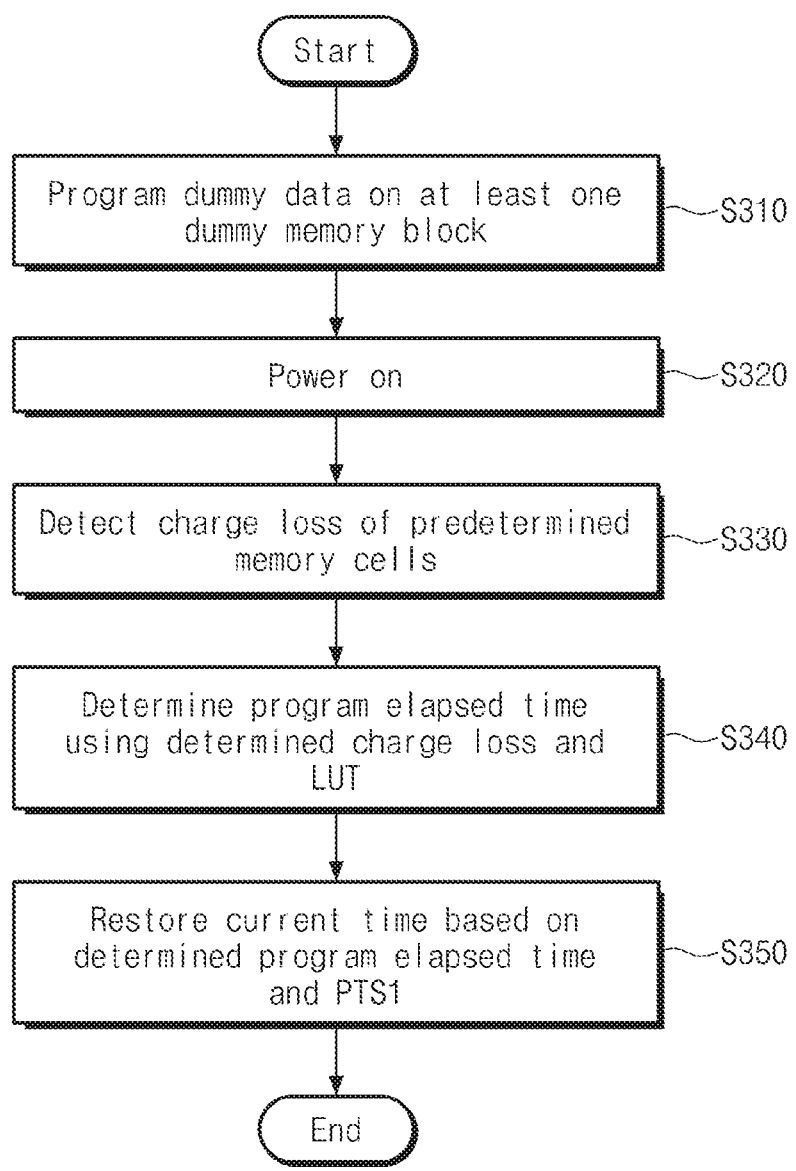
FIG. 24 is a flow chart schematically illustrating an example of an operation of a memory controller shown in FIG. 23.

FIG. 24 is a flow chart schematically illustrating an example of an operation of a memory controller shown in FIG. 23. Referring to FIGS. 23 and 24, in step S310, a memory controller 210 programs dummy data DT_d on at least one of dummy blocks during a normal power-off operation. For example, the memory controller 210 may program the dummy data DT_d in one of a plurality of dummy blocks BLK_d. Alternatively, the memory controller 210 may program at least two or more dummy data DT_d in one of the plurality of dummy blocks BLK_d. Alternatively, the memory controller 210 may program the dummy data DT_d in each of at least two or more dummy blocks BLK_d.

Steps S320 to S350 are described previously with reference to FIGS. 1 to 21, their description is omitted here.

Figure 25:
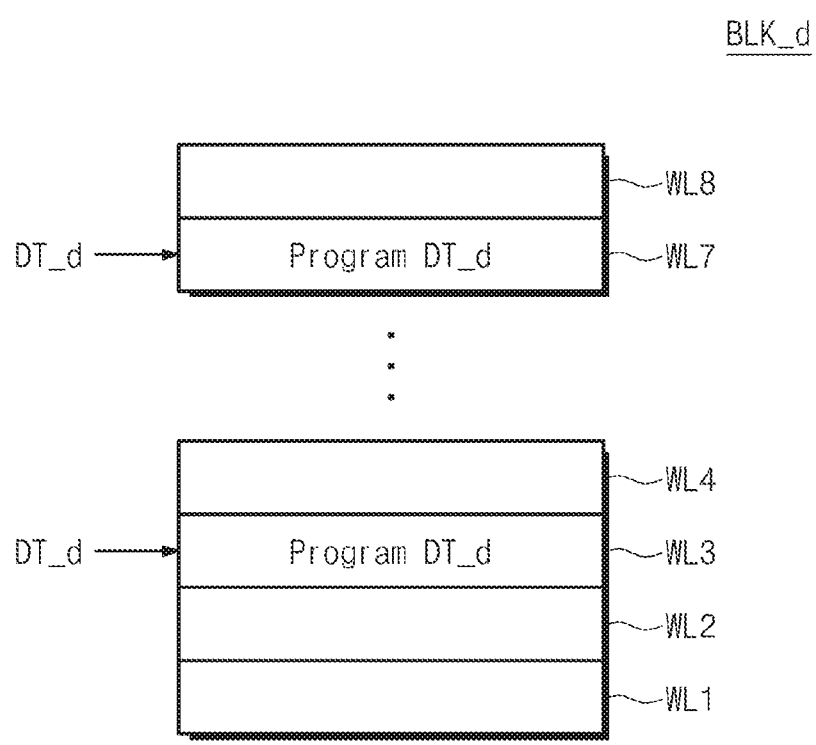
FIGS. 25 and 26 are diagrams for reference in describing step S310 shown in FIG. 24.
Figure 26:
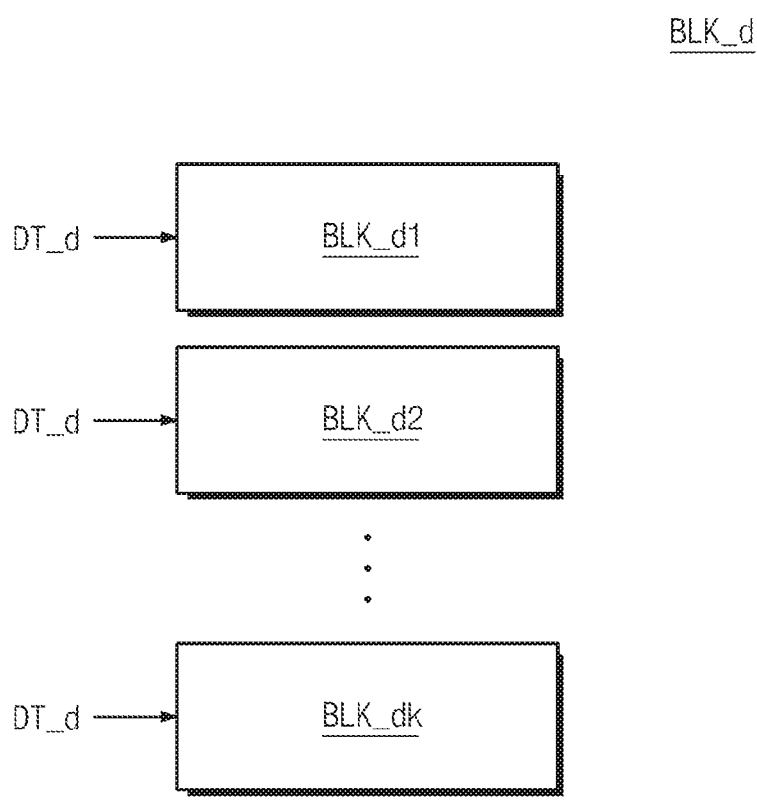

FIGS. 25 and 26 are diagrams for reference in describing step S310 shown in FIG. 24. Referring to FIGS. 23 and 24, a memory controller 210 selects a first dummy block BLK_d1 as a dummy block used to write dummy data DT_d. Connected to first to eighth wordlines WL1 to WL8 are the first dummy block BLK_d1. The memory controller 210 writes dummy data DT_d at memory cells, connected to third or seventh wordlines WL3 or WL7, from among memory cells included in the first dummy block BLK_d1. At this time, the memory cells connected to the third or seventh wordlines WL3 or WL7 may be predetermined memory cells.

At power-on, the memory controller 210 may detect charge loss of predetermined memory cells according to a method which is described with reference to FIGS. 8 to 11. Due to a location of the third wordline WL3, charge loss, or physical characteristics of memory cells connected to the third wordline WL3 may be different from that of memory cells connected to the seventh wordline WL7. In this case, the memory controller 210 may decide final charge loss based on an average or intermediate value of charge loss of memory cells connected to the third wordline WL3 and charge loss of memory cells connected to the seventh wordline WL7. The memory controller 210 may restore a current time based on the decided final charge loss.

Referring to FIGS. 24 and 26, the dummy blocks BLK_d include first to kth dummy blocks BLK_d1 to BLK_dk. The memory controller 210 writes dummy data DT_d at each of the first to kth dummy blocks BLK_d1 to BLK_dk during a normal power-off operation. At power-on, the memory controller 210 detects charge loss of memory cells of each dummy block at which the dummy data DT_d has been written. The detected charge losses of the first to kth dummy blocks BLK_d1 to BLK_dk may be different from each other. The memory controller 210 decides final charge loss, based on an intermediate or average value of the detected charge losses of the first to kth dummy blocks BLK_d1 to BLK_dk. The memory controller 210 restores a current time based on the decided final charge loss.

Although not shown in figures, the memory controller 210 may program dummy data DT_d at a part of the first to kth dummy blocks BLK_d1 to BLK_dk.

With the above description, the memory controller may program dummy data at a plurality of dummy blocks at a normal power-off operation. At power-on, the memory controller may detect charge loss of memory cells of the plurality of dummy blocks at which the dummy data has been programmed and restore a current time based on the detected charge loss. Since a program elapsed time of memory cells is detected based on the restored current time, reliability of the memory controller may be improved.

Figure 27:
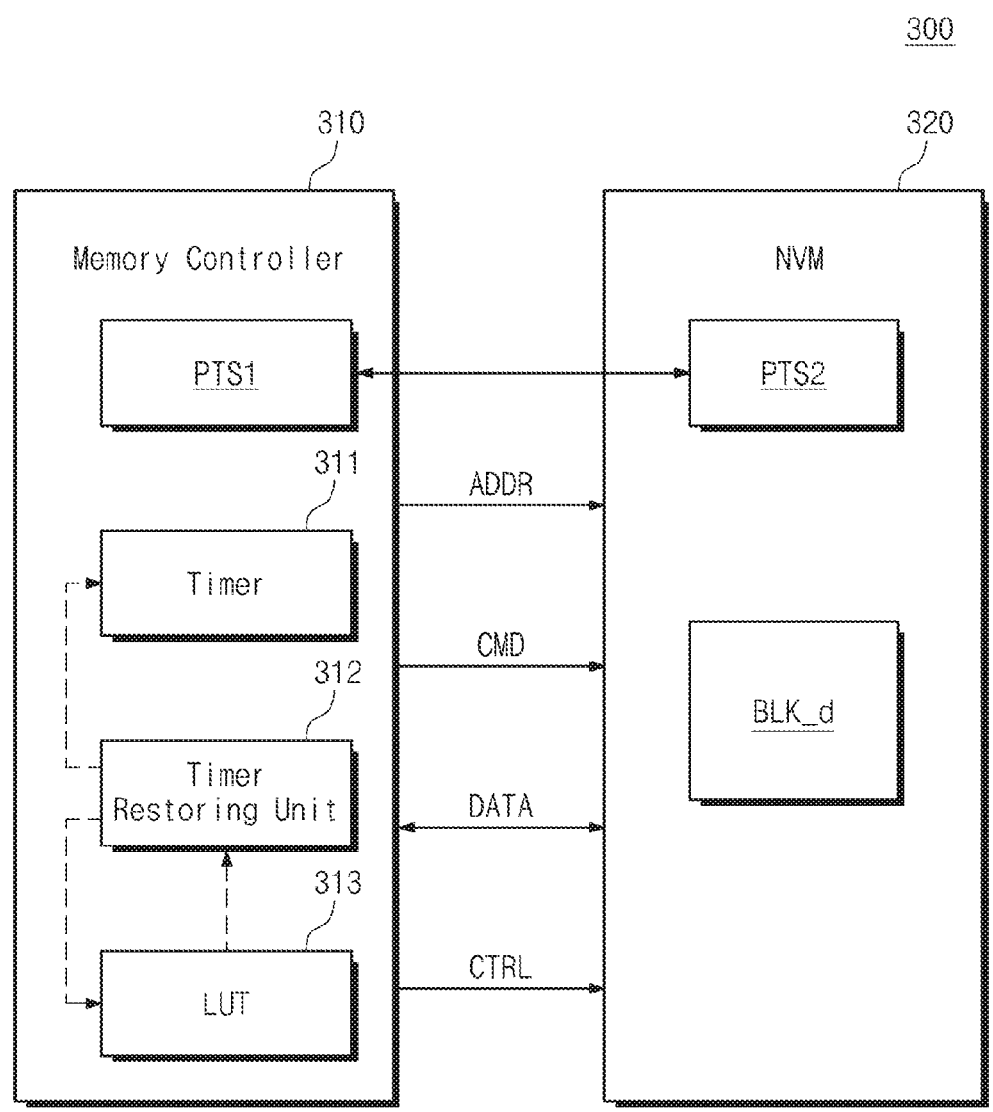
FIG. 27 is a block diagram schematically illustrating a nonvolatile memory system according to still another embodiment of the inventive concept.

FIG. 27 is a block diagram schematically illustrating a nonvolatile memory system according to still another embodiment of the inventive concepts. Referring to FIG. 27, a nonvolatile memory system 300 includes a memory controller 310 and a nonvolatile memory device 320. The memory controller 310 includes a first time table PTS1, a timer 311, a timer restoring unit 312, and LUT 313. The memory controller 310 may transfer an address ADDR, a command CMD, and a control signal CTRL to the nonvolatile memory device 320. The memory controller 310 may exchange data with the nonvolatile memory device 320. The nonvolatile memory device 320 includes a second time table PTS2 and dummy blocks BLK_d. The first time table PTS1, the timer 311, the timer restoring unit 312, the LUT 313, and the second time table PTS2 are described with reference to FIG. 1, their description is omitted.

The memory controller 310 may update the LUT 313. For example, the memory controller 310 may program dummy data at predetermined memory cells during driving, and it detects charge loss of the predetermined memory cells after a predetermined time. The memory controller 310 may update the LUT 313 based on the predetermined time and the detected charge loss. As the LUT 313 is updated under a control of the memory controller 310, a current time is accurately restored at power-on/reset even though characteristics of memory cells vary during an operation of the nonvolatile memory system 300. In exemplary embodiments, the above-described operation of the memory controller 310 may be performed periodically or randomly. Alternatively, the above-described operation of the memory controller 310 may be executed during a background operation.

Figure 28:
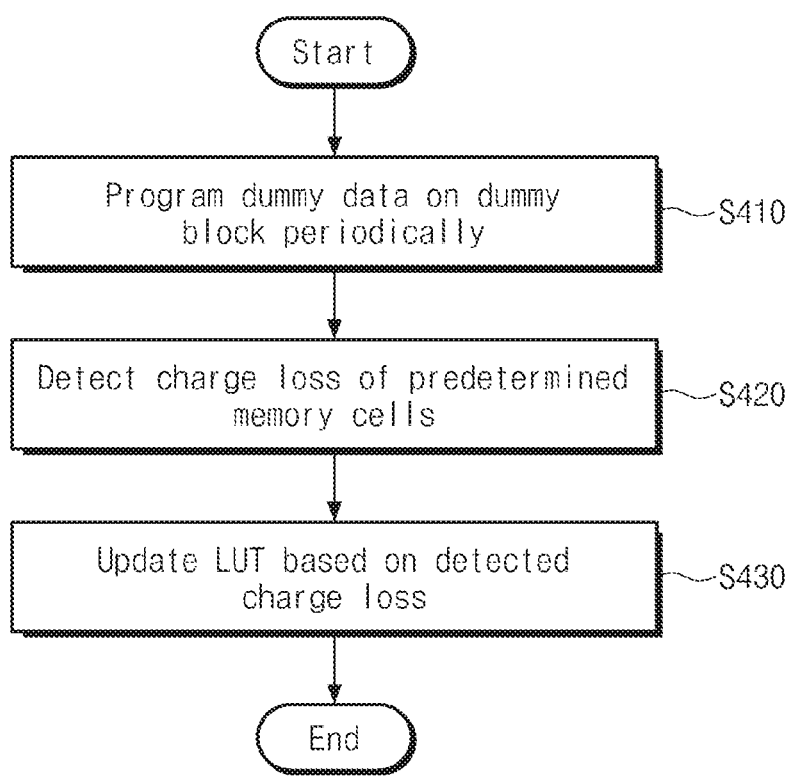
FIG. 28 is a flow chart schematically illustrating an example of an operation of a memory controller shown in FIG. 27.

FIG. 28 is a flow chart schematically illustrating an example of an operation of a memory controller shown in FIG. 27. Referring to FIGS. 27 and 28, in step S410, a memory controller 310 periodically programs dummy data DT_d at a dummy block BLK_d. In exemplary embodiments, the memory controller 310 may program dummy data DT_d at a dummy block BLK_d during a background operation. Alternatively, the memory controller 310 may program dummy data DT_d at a dummy block BLK_d during an idle time.

In step S420, the memory controller 310 detects charge loss of predetermined memory cells. In exemplary embodiments, the predetermined memory cells may be memory cells, at which the dummy data DT_d has been programmed, from among memory cells of the dummy block BLK_d.

In step S340, the memory controller 310 updates LUT 313 based on the detected charge loss. For example, the memory controller 310 may manage program time information of the dummy data DT_d. When the memory controller 310 is driving (i.e. when power is supplied to the memory controller 310), the memory controller 310 may generate a current time. The memory controller 310 may detect an accurate program elapsed time of the dummy data DT_d using the current time and the program time information. The memory controller 310 may update the LUT 313 based on the detected program elapsed time and the detected charge loss.

With the above description, the memory controller 310 updates the LUT 313 during an operation of the nonvolatile memory system 300, thereby making it possible to reduce an error of a power-off elapsed time due to a characteristic variation of memory cells. That is, it is possible to restore a current time accurately. Thus, a memory controller with improved reliability may be realized.

Figure 29:
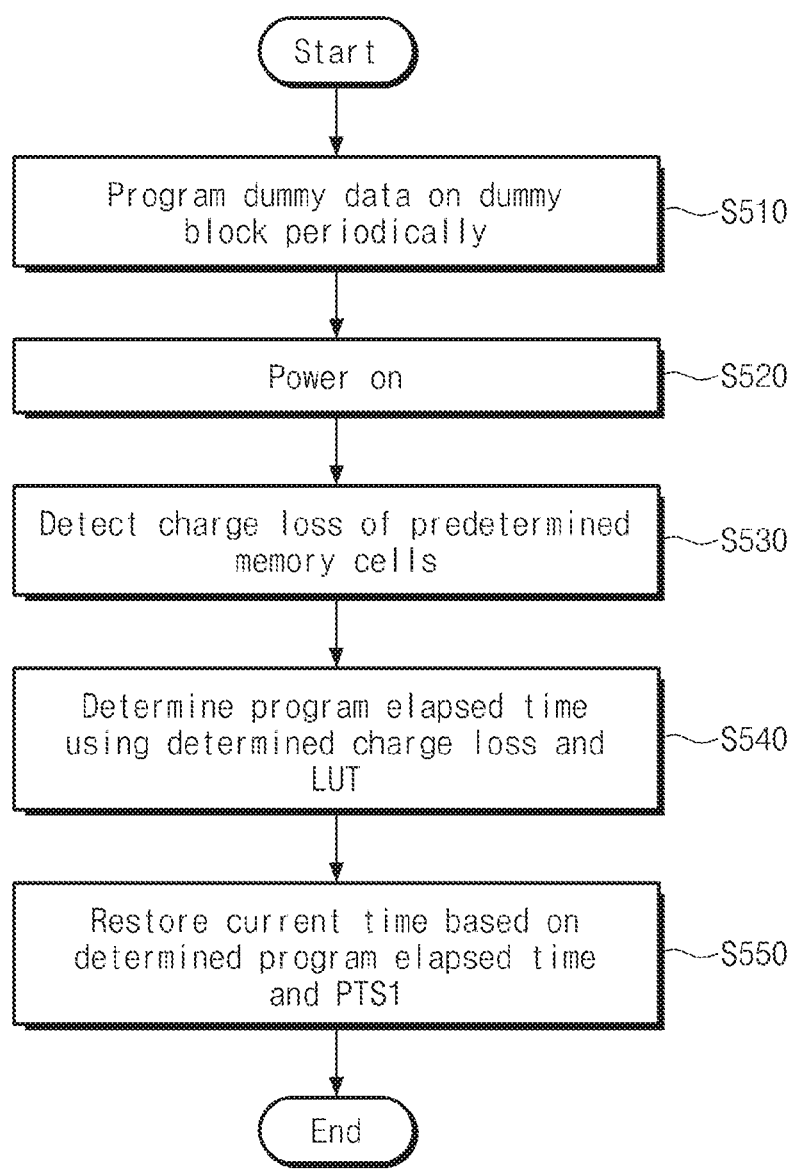
FIG. 29 is a flow chart schematically illustrating an operation of a memory controller according to still another embodiment of the inventive concept.

FIG. 29 is a flow chart schematically illustrating an operation of a memory controller according to still another embodiment of the inventive concepts. Referring to FIGS. 27 and 29, in step S510, a memory controller 310 programs dummy data DT_d at a dummy block BLK_d periodically. In exemplary embodiments, the memory controller 310 may program dummy data DT_d at a dummy block BLK_d during a background operation. Alternatively, the memory controller 310 may program dummy data DT_d at a dummy block BLK_d during an idle time.

In step S520, the memory controller 310 is powered-off and then powered-on. Thus, the memory controller 310 may be reset.

In step S530, the memory controller 310 detects charge loss of predetermined memory cells. In exemplary embodiments, the predetermined memory cells may represent memory cells, at which dummy data DT_d is most recently programmed, from among memory cells at which dummy data DT_d has been programmed in step S510.

Steps S540 and S550 are the same as steps S140 and S150 shown in previously described FIG. 6, their description is thus omitted here.

With the above description, the memory controller 310 may write dummy data DT_d at a dummy block BLK_d periodically or randomly during driving. In exemplary embodiments, the dummy data DT_d may mean data that is used to detect charge loss of memory cells at power-on. Thus, even in the case where a sudden power-off state occurs (i.e., power is lost unexpectedly and without a normal power down operation), a timer is restored based on the most recently programmed dummy data. Thus, provided is the memory controller with improved reliability.

Figure 30:
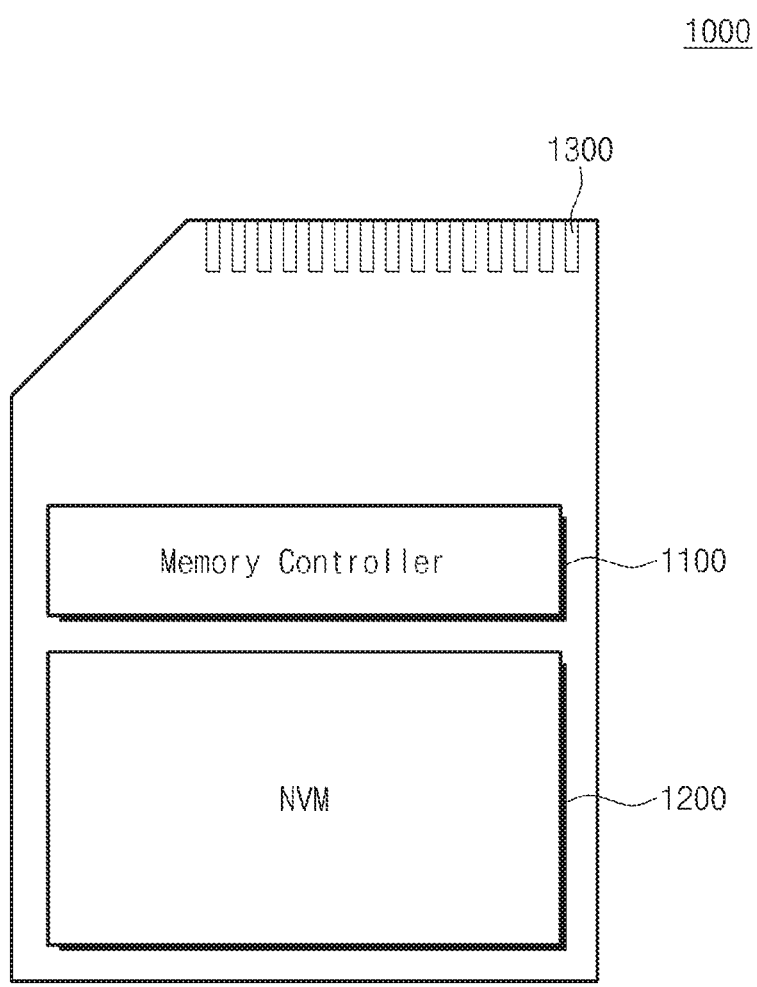
FIG. 30 is a block diagram schematically illustrating a memory card system including a nonvolatile memory system according to embodiments of the inventive concept.

FIG. 30 is a block diagram schematically illustrating a memory card system including a nonvolatile memory system according to embodiments of the inventive concepts. Referring to FIG. 30, a memory card system 1000 contains a controller 1100, a nonvolatile memory 1200, and a connector 1300.

The controller 1100 is connected to the nonvolatile memory 1200. The controller 1100 is configured to access the nonvolatile memory 1200. For example, the controller 1100 may be adapted to control an overall operation of the nonvolatile memory 1200 including a read operation, a write operation, an erase operation, a background operation, and so on. The controller 1100 provides an interface between the nonvolatile memory 1200 and a host. The controller 1100 may be configured to drive firmware for controlling the nonvolatile memory 1200.

In exemplary embodiments, the controller 1100 may include components such as a RAM, a processing unit, a host interface, a memory interface, an error correction unit, and so on.

The controller 1100 may communicate with an external device according to a particular communication protocol. For example, the controller 1100 may communicate with the external device through at least one of various interface protocols such as a universal serial bus (USB) protocol, a multimedia card (MMC) protocol, an embedded MMC (eMMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, an universal flash storage (UFS) protocol and so on.

In exemplary embodiments, the controller 1100 and the nonvolatile memory 1200 may include a memory controller and a nonvolatile memory device described with reference to FIGS. 1 to 29. The nonvolatile memory 1200 may be implemented with a variety of nonvolatile memory devices, such as an EPROM (Electrically Erasable and Programmable ROM), a NAND flash memory, a NOR flash memory, a PRAM (Phase-change RAM), an ReRAM (Resistive RAM), a FRAM (Ferroelectric RAM), an STT-MRAM (Spin-Torque Magnetic RAM), and so on.

In exemplary embodiments, the controller 1100 and the nonvolatile memory 1200 may be integrated in a single semiconductor device to form a solid state drive (SSD). The controller 1100 and the nonvolatile memory 1200 may be integrated in a single semiconductor device. For example, the controller 1100 and the nonvolatile memory 1200 may be integrated in a single semiconductor device to form a memory card such as a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), a universal flash storage (UFS), and so on.

A nonvolatile memory 1200 and/or a memory card system 1000 according to the inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and so on.

Figure 31:
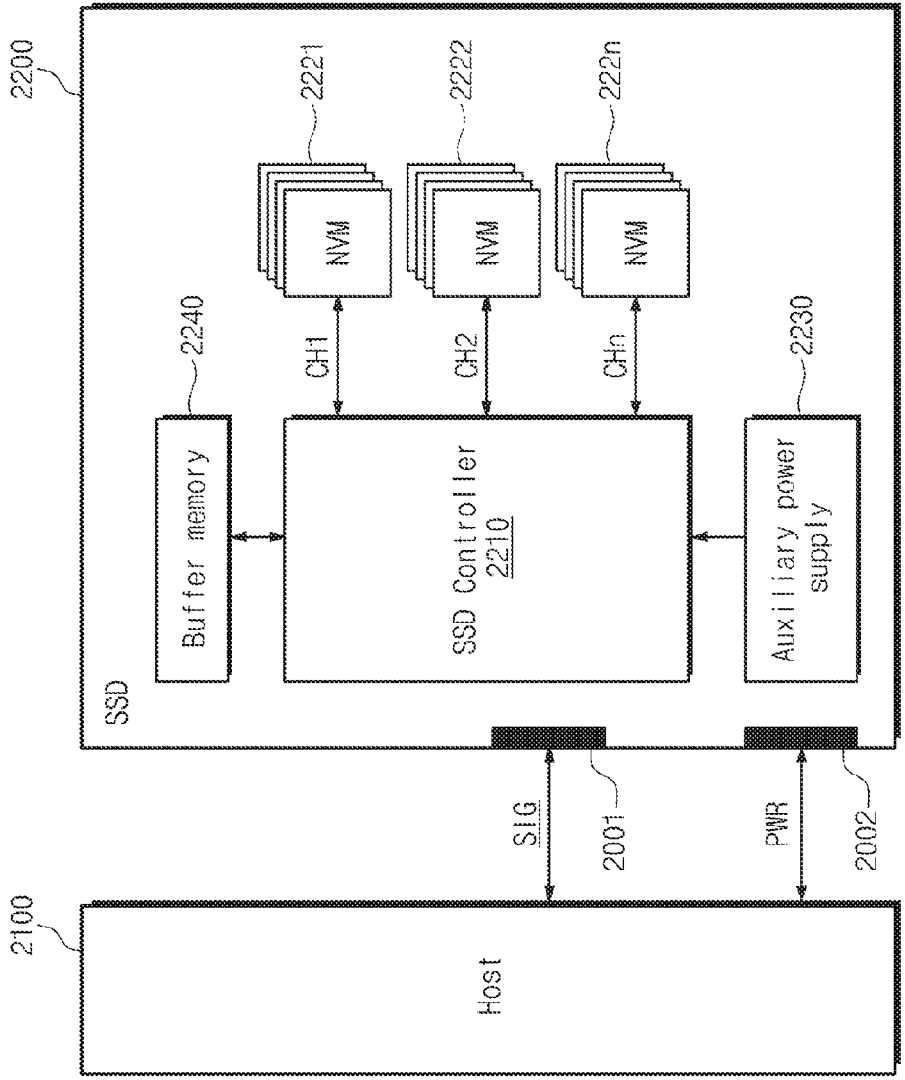
FIG. 31 is a block diagram illustrating a solid state drive including a nonvolatile memory system according to an embodiment of the inventive concepts.

FIG. 31 is a block diagram illustrating a solid state drive including a nonvolatile memory system according to an embodiment of the inventive concepts. Referring to FIG. 31, a solid state drive (SSD) system 2000 comprises a host 2100 and an SSD 2200. The SSD 2200 exchanges signals SGL with the host 2100 through the host interface 2001 and is supplied with a power through a power connector 2002. The SSD 2200 comprises a plurality of nonvolatile memories 2221 to 222n, an SSD controller 2210, an auxiliary power supply 2230, and a buffer memory 2240.

The SSD controller 2210 controls the nonvolatile memories 2221 to 222n in response to a signal SIG from the host 2100. For example, the SSD controller 2210 and the nonvolatile memories 2221 to 222n may include a memory controller and a nonvolatile memory device described with reference to FIGS. 1 to 28.

The auxiliary power supply 2230 is connected to the host 2100 via the power connector 2002. The auxiliary power supply 2230 is charged by a power PWR from the host 2100. When a power is not smoothly supplied from the host 2100, the auxiliary power supply 2230 powers the SSD system 2000. The auxiliary power supply 2230 may be placed inside or outside the SSD 2200. For example, the auxiliary power supply 2230 may be put on a main board to supply an auxiliary power to the SSD 2200.

The buffer memory 2240 acts as a buffer memory of the SSD 2200. For example, the buffer memory 2240 temporarily stores data received from the host 2100 or from the nonvolatile memory devices 2221 to 222n as flash memories, or it temporarily stores metadata (e.g., mapping tables) of the flash memories 2221 to 222n. The buffer memory 2240 may include volatile memories such as DRAM, SDRAM, DDR SDRAM, LPDDR SDRAM, SRAM, and so on or nonvolatile memories such as FRAM ReRAM, STT-MRAM, PRAM, and so on.

Figure 32:
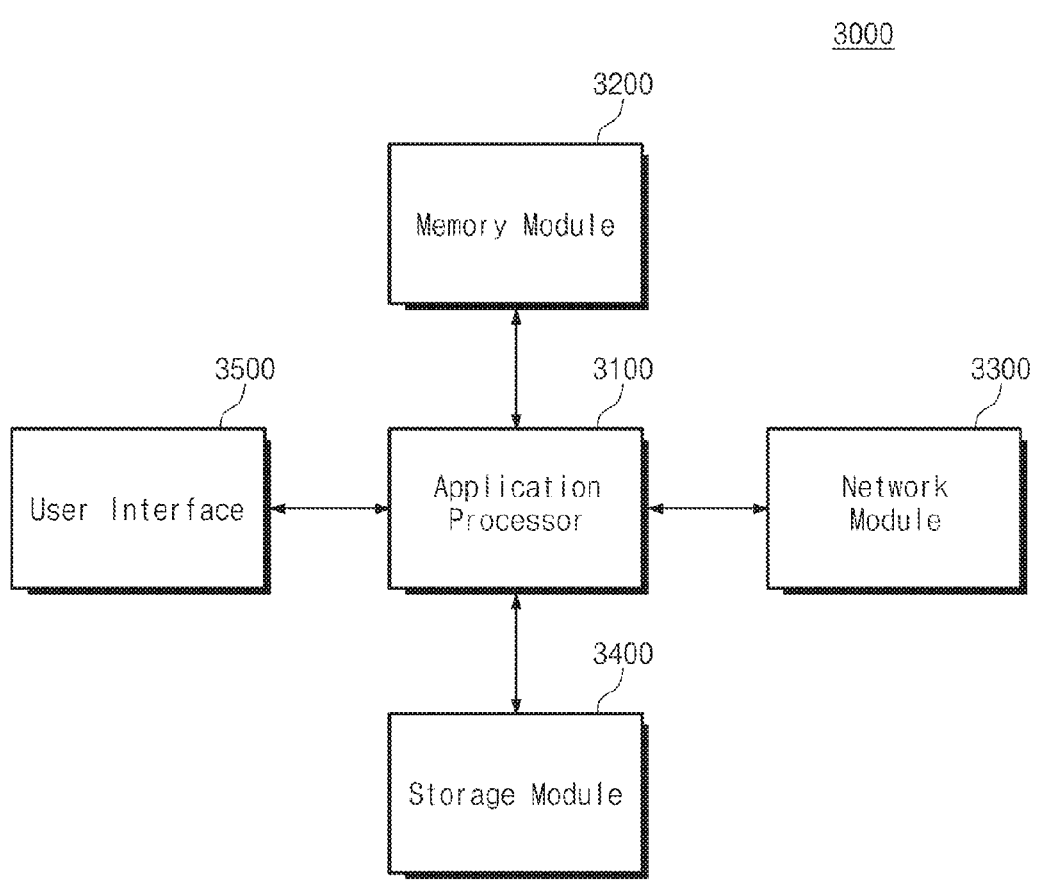
FIG. 32 is a block diagram schematically illustrating a user system including a nonvolatile memory system according to an embodiment of the inventive concepts.

FIG. 32 is a block diagram schematically illustrating a user system including a nonvolatile memory system according to an embodiment of the inventive concepts. Referring to FIG. 32, a user system 3000 includes an application processor 3100, a memory module 3200, a network module 3300, a storage module 3400, and an input interface 3500.

The application processor 3100 drives components of the user system 3000, an operating system, and so on. For example, the application processor 3100 may include controllers for controlling components of the user system 3000, graphics engines, a variety of interfaces, and so on. The application processor 3100 may be implemented with a system-on-chip (SoC).

The memory module 3200 operates as a main memory, a working memory, a buffer memory, or a cache memory of the user system 3000. The memory module 3200 may be implemented with a volatile random access memory, such as DRAM (Dynamic Random Access Memory), SDRAM (Synchronous DRAM), DDR SDRAM (Double Date Rate SDRAM), DDR2 SDRAM, DDR3 SDRAM, LPDDR DRAM, LPDDR2 DRAM, or LPDDR3 DRAM or a nonvolatile random access memory, such as PRAM (Phase-change RAM), MRAM (Magnetic RAM), RRAM (Resistive RAM), or FRAM (Ferroelectric RAM). In exemplary embodiments, the memory module 3200 may be packaged with the application processor 3100 based on packaging technologies such as Package on Package (POP), Multi Chip Package (MCP) and so on.

The network module 3300 communicates with external devices. For example, the network module 3300 may support wireless communications, such as CDMA (Code Division Multiple Access), GSM (Global System for Mobile communication), WCDMA (wideband CDMA), CDMA-2000, TDMA (Time Division Multiple Access), LTE (Long Term Evolution), Wimax, WLAN, UWB, Bluetooth, WI-DI, and so on. In exemplary embodiments, the network module 3300 is included in the application processor 3100.

The storage module 3400 stores data. For example, the storage module 3400 stores data received from an external device. Alternatively, the storage module 3400 provides the application processor 3100 with data stored therein. For example, the storage module 3400 may be implemented with a semiconductor memory device such as PRAM, MRAM, RRAM, NAND flash memory, NOR flash memory, or a three-dimensional NAND flash memory.

In exemplary embodiments, the storage module 3400 may be a nonvolatile memory system described with reference to FIGS. 1 to 28. The storage module 3400 may operate based on an operating method described with reference to FIGS. 1 to 28.

The input interface 3500 may provide interfaces for providing data or commands to the application processor 3100 or for outputting data to an external device. For example, the input interface 3500 may include user input interfaces, such as a key board, a key pad, a button, a touch panel, a touch screen, a touch pad, a touch ball, a camera, a microphone, a Gyroscope, a vibration sensor, a piezoelectric element, and so on. The input interface 3500 may include user output interfaces, such as an LCD (Liquid Crystal Display) device, an OLED (Organic Light Emitting Diode) display device, an AMOLED (Active Matrix OLED) display device, an LED, a speaker, a motor, and so on.

With embodiments of the inventive concepts, a memory controller contains a timer to generate a current time and manages program time information of a nonvolatile memory device based on the generated current time. When powered on or reset, the memory controller detects charge loss of predetermined memory cells of memory cells included in a nonvolatile memory device to restore a current time. The memory controller detects a power-off elapsed time based on the detected charge loss, and it restores a current time based on the power-off elapsed time thus detected. The memory controller manages program time information of the nonvolatile memory device according to the restored current time, thereby improving reliability of the nonvolatile memory system.

While the inventive concept has been described with reference to exemplary embodiments, it will be apparent to those skilled in the art that various changes and modifications may be made without departing from the spirit and scope of the present inventive concepts. Therefore, it should be understood that the above embodiments are not limiting, but illustrative.

What is claimed is:

1. A nonvolatile memory system comprising:
   a nonvolatile memory device including a plurality of memory cells; and
   a memory controller configured to count a clock signal to generate a current time, program dummy data in predetermined memory cells among the plurality of memory cells before entering a power-off state, detect a charge loss of the predetermined memory cells when a power-on state occurs after the power-off state, and restore the current time based on the detected charge loss, and wherein:
   the predetermined memory cells are memory cells connected to at least two or more wordlines, and
   the memory controller includes a timer that counts the clock to generate the current time.

2. The nonvolatile memory system of claim 1, wherein:
   the memory controller includes a lookup table storing information on a relation between program elapsed times and charge losses,
   the memory controller is configured to detect a program elapsed time of the predetermined memory cells based on the detected charge loss and the lookup table,
   the memory controller further includes a time table storing program time information of the predetermined memory cells,
   the memory controller is configured to restore the current time based on the program time information of the predetermined memory cells of the time table and the detected program elapsed time,
   the time table further includes program time information of the plurality of memory cells, and
   the memory controller adjusts a plurality of read voltages of the nonvolatile memory device based on the time table and the restored current time.

3. The nonvolatile memory system of claim 1, wherein:
   the memory controller is configured to detect the charge loss based on at least one of characteristics of the predetermined memory cells,
   the characteristics include at least one of the number of on cells, the number of off cells, a peak value of a threshold voltage distribution of the predetermined memory cells, a lower value of the threshold voltage distribution of the predetermined memory cells, and a valley value of the threshold voltage distribution of the predetermined memory cells,
   the number of on cells is the number of memory cells turned on when a reference voltage is applied to the predetermined memory cells, and
   the number of off cells is the number of memory cells turned off when the reference voltage is applied to the predetermined memory cells.

4. The nonvolatile memory system of claim 1, wherein:
   the nonvolatile memory device further comprises at least one dummy block, and
   the memory controller is configured to select memory cells of a portion of the at least one dummy block as the predetermined memory cells and program the dummy data at the selected memory cells.

5. The nonvolatile memory system of claim 1, wherein the memory controller is configured to detect charge losses of the predetermined memory cells and restore the current time based on one of an average value and an intermediate value of the detected charge losses.

6. The nonvolatile memory system of claim 1, wherein the plurality of memory cells are charge trap flash memory cells.

7. The nonvolatile memory system of claim 1, wherein the clock is received from an external device.

8. The nonvolatile memory system of claim 1, wherein the clock is generated in the memory controller.

9. A nonvolatile memory system comprising:
   a nonvolatile memory device including a plurality of memory cells; and
   a memory controller configured to count a clock signal to generate a current time, and periodically program dummy data in predetermined memory cells among the plurality of memory cells, wherein:
   the memory controller is further configured to detect a charge loss of memory cells among the predetermined memory cells at which dummy data is most recently programmed when a power-on state occurs after a power-off state,
   the power-off state is a result of a sudden loss of power, and
   the memory controller includes a timer that counts the clock to generate the current time.

10. The nonvolatile memory system of claim 9, wherein the memory controller includes a lookup table storing information on a relation between the charge loss and an elapsed time.

11. The nonvolatile memory system of claim 10, wherein the memory controller is configured to restore the current time based on the detected charge loss and the lookup table.

12. The nonvolatile memory system of claim 11, wherein the memory controller is configured to periodically detect a charge loss of memory cells at which the dummy data is programmed and update the lookup table based on the periodically detected charge loss.

13. A nonvolatile memory system comprising:
a nonvolatile memory device including a plurality of memory cells; and
a memory controller configured to count a clock to generate a current time, detect a charge loss of most recently programmed memory cells among the plurality of memory cells when a power-on state occurs after a power-off state, and restore the current time based on the detected charge loss, wherein
the memory controller includes a timer that counts the clock to generate the current time.

* * * * *